US012777828B2

(12) United States Patent
Kim et al.

(10) Patent No.: US 12,777,828 B2
(45) Date of Patent: Oct. 27, 2026

(54) DISPLAY PANEL AND DISPLAY APPARATUS INCLUDING THE SAME

(71) Applicant: Samsung Display Co., Ltd., Yongin-Si (KR)

(72) Inventors: Taehyun Kim, Yongin-si (KR); Hayun Kang, Yongin-si (KR); Kyungmin Kim, Yongin-si (KR); Sangwoo Kim, Yongin-si (KR); Gyehwan Lim, Yongin-si (KR); Myunghee Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 293 days.

(21) Appl. No.: 18/605,827

(22) Filed: Mar. 15, 2024

(65) Prior Publication Data

US 2024/0324431 A1 Sep. 26, 2024

(30) Foreign Application Priority Data

Mar. 24, 2023 (KR) ........................ 10-2023-0039097
Apr. 25, 2023 (KR) ........................ 10-2023-0054199

(51) Int. Cl.

| | |
|---|---|
| ***H10K 59/88*** | (2023.01) |
| ***H10K 59/40*** | (2023.01) |
| ***H10K 59/65*** | (2023.01) |
| ***H10K 59/80*** | (2023.01) |

(52) U.S. Cl.
CPC ............. *H10K 59/88* (2023.02); *H10K 59/40* (2023.02); *H10K 59/65* (2023.02); *H10K 59/873* (2023.02); *H10K 59/8791* (2023.02)

(58) Field of Classification Search
CPC ................................................ H10K 59/10–95
See application file for complete search history.

(56) References Cited

U.S. PATENT DOCUMENTS

| | | | | |
|---|---|---|---|---|
| 11,569,321 | B2 | 1/2023 | Lee et al. | |
| 2021/0399070 | A1 | 12/2021 | Jung et al. | |
| 2021/0399262 | A1 | 12/2021 | Woo et al. | |
| 2023/0337487 | A1* | 10/2023 | Bang .................... | H10K 59/873 |

FOREIGN PATENT DOCUMENTS

| | | | |
|---|---|---|---|
| KR | 10-2124827 | B1 | 6/2020 |
| KR | 10-2182881 | B1 | 11/2020 |
| KR | 10-2021-0156373 | A | 12/2021 |
| KR | 10-2021-0157947 | A | 12/2021 |
| KR | 10-2022-0006689 | A | 1/2022 |

* cited by examiner

*Primary Examiner* — Thanhha S Pham
(74) *Attorney, Agent, or Firm* — Innovation Counsel LLP

(57) ABSTRACT

Provided are a display panel and a display apparatus, wherein the display panel and the display apparatus include a substrate, a display layer including a display element, a dam portion including a plurality of dams arranged, a groove spaced apart from the dam portion, and an input sensing layer disposed on the display layer, and an alignment mark including a plurality of stacked alignment mark layers, detectable to an outside device and arranged between the dam portion and the groove, wherein the plurality of alignment mark layers are in direct contact with each other, and at least one of the plurality of alignment mark layers includes the same material as at least one of a plurality of conductive layers in at least one of the display layer and the input sensing layer.

27 Claims, 22 Drawing Sheets

DISPLAY PANEL AND DISPLAY APPARATUS INCLUDING THE SAME

CROSS-REFERENCE TO RELATED APPLICATIONS

This application is based on and claims priority, under 35 U.S.C. § 119, to Korean Patent Application No. 10-2023-0039097 filed on Mar. 24, 2023 and Korean Patent Application No. 10-2023-0054199 filed on Apr. 25, 2023 in the Korean Intellectual Property Office, the disclosures of which are incorporated by reference herein in their entirety.

BACKGROUND

1. Field

This disclosure relates to a display panel and a display apparatus including the same, and more particularly, to a display panel and a display apparatus that has an extended display area so that images may be displayed in side and corner display areas.

2. Description of the Related Art

In recent years, the designs of display apparatuses have diversified. For example, curved display apparatuses, foldable display apparatuses, and rollable display apparatuses are being developed. In addition, display areas are expanding and non-display areas are shrinking. As a result, various methods are being derived to design the shape of a display apparatus.

SUMMARY

The disclosure pertains to a display panel that has an expanded display area so that an image may be displayed even in a corner display area, and a display apparatus including the same.

Additional aspects will be set forth in part in the description which follows and, in part, will be apparent from the description, or may be learned by practice of the presented embodiments of the disclosure.

Disclosed is a display panel including a substrate which includes a display area and a peripheral area adjacent to the display area, a display layer including a display element arranged in the display area, a dam portion including a plurality of dams arranged in the peripheral area, a groove arranged in the peripheral area and spaced apart from the dam portion, and an input sensing layer disposed on the display layer, and an alignment mark including a plurality of stacked alignment mark layers that are detectable to an outside device and arranged between the dam portion and the groove, wherein, the plurality of alignment mark layers are in direct contact with each other, and at least one of the plurality of alignment mark layers includes the same material as at least one of a plurality of conductive layers arranged on a layer having the same material as at least one of the display layer and the input sensing layer.

Two of the plurality of alignment mark layers may include the same material as one of a gate electrode, a source electrode, a drain electrode, a connection electrode, a pixel electrode, a counter electrode, a first touch electrode, a second touch electrode, a common voltage line, and a connection wiring.

A thickness of the alignment mark may be greater than a thickness of one of the plurality of conductive layers.

In another aspect, the disclosure pertains to a display panel including a substrate which includes a display area and a peripheral area adjacent to the display area, a display layer including a display element arranged in the display area, an optical function layer including a first layer and a second layer and disposed over the display layer, an alignment mark arranged in the peripheral area of the substrate, and a valley unit including at least one valley which is arranged to wrap around at least a portion of the alignment mark on a plan view and including at least one valley that blocks a flow of a material forming the second layer.

The valley unit may include a valley reinforced wall defining a boundary of the valley unit.

The valley reinforced wall may be made of the same material as the first layer.

The valley unit may include a first valley unit extending in a first direction and a second valley unit extending from the first valley unit in a second direction.

A valley reinforced wall defining a border of the valley unit may include at least one of angles and curvatures.

The valley unit may include a first valley reinforced wall defining a border of the valley unit and a second valley reinforced wall arranged with the valley that is enclosed by the first valley reinforced wall.

The display panel may further comprise: a dam portion including a plurality of dams arranged in the peripheral area; and a groove arranged in the peripheral area and spaced apart from the dam portion, and the valley unit may be arranged between the dam portion and the groove.

The valley unit may be provided with a receiver in which the alignment mark is arranged.

The alignment mark may include a plurality of alignment mark layers including a layer having the same material as at least one of a plurality of conductive layers of at least one of the display layer and an input sensing layer.

The plurality of alignment mark layers may be stacked on each other.

According to one or more embodiments, one of the plurality of alignment mark layers and another of the plurality of alignment mark layers may be in direct contact with each other.

A thickness of the alignment mark may be greater than a thickness of one of the plurality of conductive layers.

Disclosed is a display apparatus including a cover window which includes a flat surface portion and a curved surface portion curved at a corner of the flat surface portion, a display panel arranged on one side of the cover window and comprising a substrate that has a display area overlapping the flat surface portion and a peripheral area surrounding the display area, wherein the display panel includes a display layer including a display element arranged in the display area, an optical function layer including a first layer and a second layer and disposed on the display layer, an alignment mark arranged in the peripheral area of the substrate, and a valley unit including at least one valley that wraps around at least a portion of the alignment mark and blocks a flow of a material forming the second layer.

The valley unit may include a valley reinforced wall defining a border of the valley unit.

The valley unit may include a first valley unit extending in a first direction and a second valley unit extending from the first valley unit in a second direction.

A valley reinforced wall defining a border of the valley unit may include at least one of angles and curves.

The valley unit may include a first valley reinforced wall defining a border of the valley unit and a second valley reinforced wall arranged within the valley that is enclosed by the first valley reinforced wall.

The display panel may further include a dam portion including a plurality of dams arranged in the peripheral area, and a groove arranged in the peripheral area and spaced apart from the dam portion, and the valley unit may be arranged between the dam portion and the groove.

According to one or more embodiments, the valley unit may be provided with a receiver in which the alignment mark is arranged.

The alignment mark may include a plurality of alignment mark layers including a layer that is made of the same material as at least one of a plurality of conductive layers of at least one of the display layer and an input sensing layer.

The plurality of alignment mark layers may be stacked on each other.

Two of the plurality of alignment mark layers may be in direct contact with each other.

A thickness of the alignment mark may be greater than a thickness of one of the plurality of conductive layers.

The display panel may be arranged in an inner side of the front display area, and may further include an opening area and a non-display area arranged between the opening area and the front display area, wherein a component corresponding to the opening area may be further disposed below the display panel.

Other aspects, features, and advantages in addition to those described above will become apparent from the following drawings, claims, and detailed description of the disclosure.

These general and specific aspects may be practiced using any system, method, computer program, or combination of systems, methods, and computer programs.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
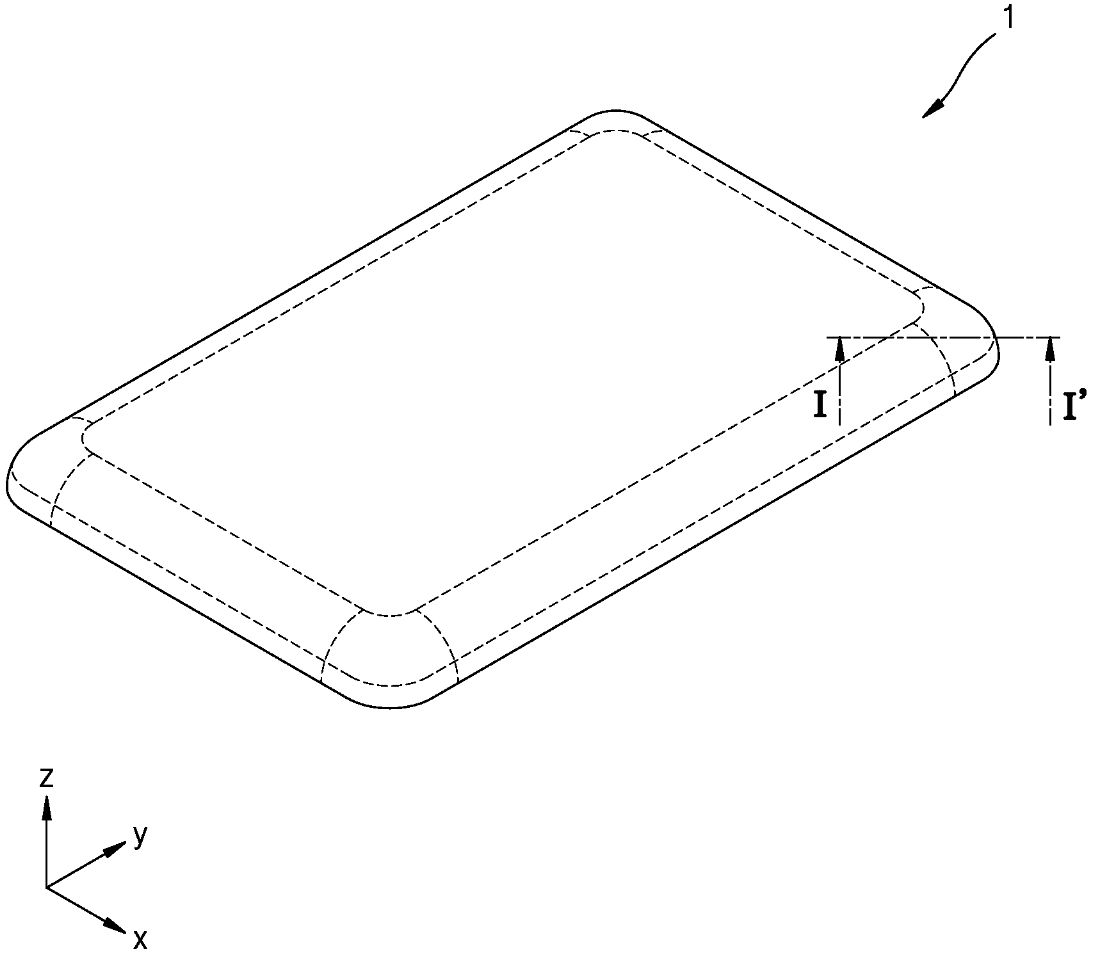
FIG. 1 is a perspective view schematically illustrating a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure is subject to various modifications and may have many embodiments, certain of which are illustrated in the drawings and further described in the detailed description. The effects and features of the disclosure, and methods of achieving them, will become apparent with reference to the embodiments described in detail in conjunction with the drawings. However, the disclosure is not limited to the embodiments described herein and may be implemented in various forms.

Hereinafter, the embodiments will be described in detail with reference to the accompanying drawings, and when describing with reference to the drawings, identical or corresponding components will be given the same drawing designation and duplicate descriptions will be omitted.

In the following embodiments, the terms first, second, etc. are not intended to be limiting, but are used to distinguish one component from another.

In the following embodiments, the singular expression includes the plural unless the context clearly indicates otherwise.

In the following embodiments, the terms include or have been intended to imply the presence of the recited features or components and do not preclude the possibility of the addition of one or more other features or components.

In the following embodiments, when a portion of a membrane, area, component, etc. is said to be on or on top of another portion, this includes not only when it is directly on top of the another portion, but also when there are other membranes, areas, components, etc. arranged therebetween.

In the drawings, components may be exaggerated or reduced in size for ease of explanation. For example, the size and thickness of each configuration shown in the drawings are arbitrary for ease of explanation and the disclosure is not necessarily limited to those shown.

In the following embodiments, the terms x direction, y direction, and z direction are not limited to, but may be interpreted in a broad sense to include, three axes in a Cartesian coordinate system. For example, the x direction, y direction, and z direction may be orthogonal to each other, but may also refer to different directions that are not orthogonal to each other.

In some embodiments, a particular sequence of processes may be performed in a different order than that described. For example, two processes described in succession may be performed substantially simultaneously, or may be performed in the reverse order from the order described.

FIG. 1 is a perspective view schematically illustrating a display apparatus according to an embodiment.

Referring to FIG. 1, a display apparatus 1 according to an embodiment is an apparatus for displaying video and still images, which may be a mobile phone, a smartphone, a tablet personal computer, and a portable electronic apparatus such as a mobile communication terminal, an electronic notebook, an e-book, a portable multimedia player (PMP), a navigation apparatus, an ultra-mobile personal computer (UMPC), etc. In addition, the display apparatus 1 may be an electronic apparatus that provides a display screen for a television, laptop, monitor, billboard, internet of things (IOT) devices, etc. Alternatively, the display apparatus 1 may be a wearable device, such as a smart watch, a watch phone, an eyewear display, or a head mounted display (HMD).

In an embodiment, the display apparatus 1 may have a rectangular shape in a plan view. As an optional embodiment, the display apparatus 1 may have other shapes such as other polygons such as a triangle, a square, etc., a circle, an oval, etc. In an embodiment, when the display apparatus 1 has the shape of a polygon in a plan view, the polygonal corners may be rounded. For ease of explanation, the following description will focus on the display apparatus 1 having the shape of a rectangle with rounded corners in a plan view.

The display apparatus 1 may have a short side in a first direction (for example, x direction or −x direction) and a long side in a second direction (for example, y direction or −y direction). In another embodiment, the display apparatus 1 may have a length of a side in the first direction (for example, x direction or −x direction) and a length of a side in the second direction (for example, y direction or −y direction) that are equal. In another embodiment, the display apparatus 1 may have a long side in the first direction (for example, x direction or −x direction) and a short side in the second direction (for example, y direction or −y direction). Each corner where the short side in the first direction (for example, x direction or −x direction) and the long side in the second direction (for example, y direction or −y direction) meet may be rounded to have a certain curvature.

Figure 2:
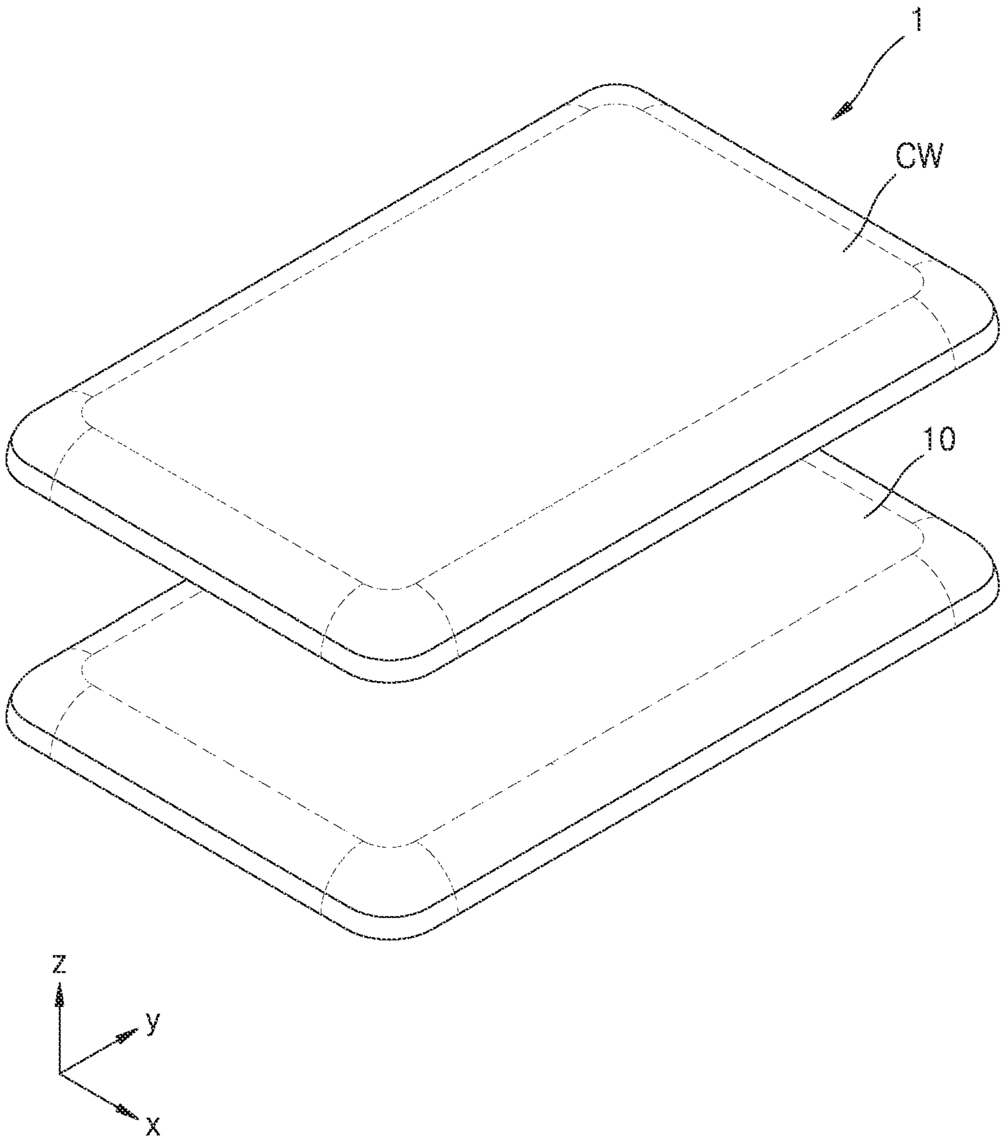
FIG. 2 is an exploded perspective view schematically illustrating a display panel and a cover window, respectively, of a display apparatus according to an embodiment.
Figure 3:
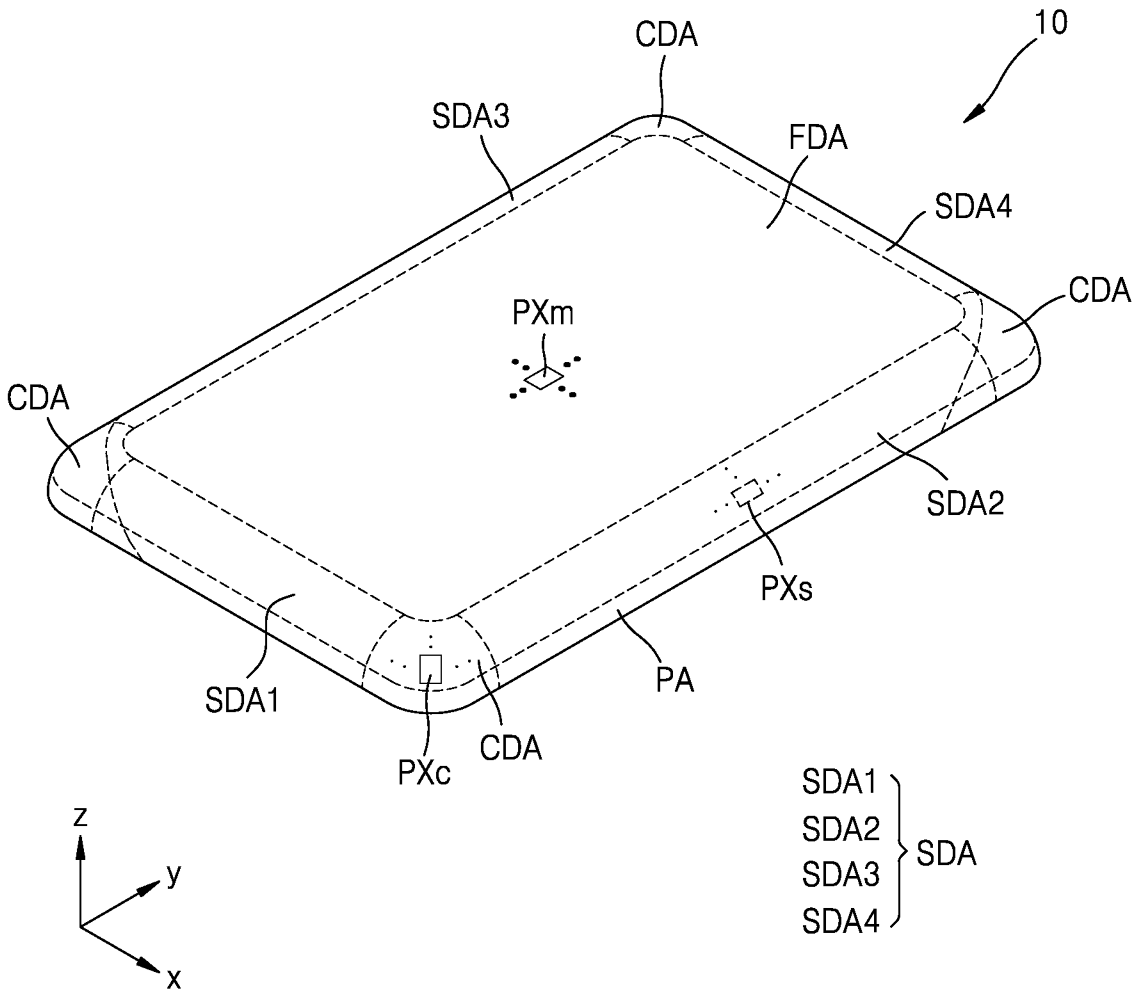
FIG. 3 is a perspective view schematically illustrating a display panel of a display apparatus according to an embodiment.
Figure 4:
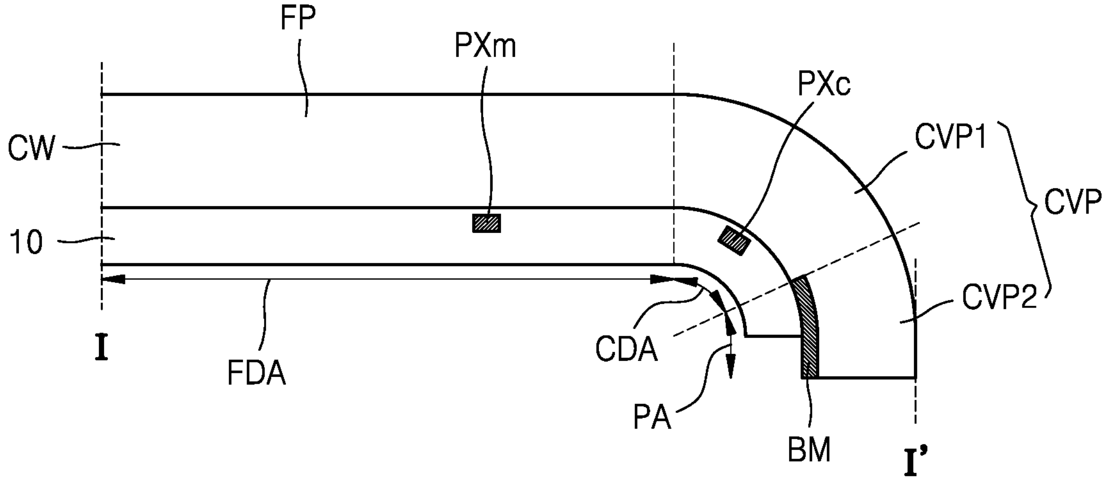
FIG. 4 is a cross-sectional view of a display apparatus, taken along line I-I' of FIG. 1.

FIG. 2 is an exploded perspective view schematically illustrating a display panel and a cover window, respectively, of a display apparatus according to an embodiment. FIG. 3 is a perspective view schematically illustrating a display panel of a display apparatus according to an embodiment. FIG. 4 is a cross-sectional view of a display apparatus, taken along line I-I' of FIG. 1.

Referring to FIG. 2 to FIG. 4, the display apparatus 1 may include a display panel 10 and a cover window CW disposed on the display panel 10.

The display panel 10 may include a front display area FDA, a side display area SDA, and a corner display area CDA as display areas. The display apparatus 1 may include a peripheral area PA surrounding these display areas.

The front display area FDA is an area arranged at the front of the display panel 10 and may be a flat, unbent area. The front display area FDA may include the largest percentage of the display area of the display panel 10 and may therefore provide the majority of the image. In other words, the front display area FDA may be the main display area. The front display area FDA includes a short side in the x direction and a long side in the y direction, and each corner where the short and long sides meet may be rounded.

The side display area SDA may include a curved surface that is at least partially bent and may extend outwardly from each side of the front display area FDA. The side display area SDA may include a first side display area SDA1, a second side display area SDA2, a third side display area SDA3, and a fourth side display area SDA4 adjacent to the four different edges of the front display area FDA. In some embodiments, at least one of the first side display area SDA1, second side display area SDA2, third side display area SDA3, and fourth side display area SDA4 may be omitted.

The first side display area SDA1 may be an area that extends from a first side of the front display area FDA and is curved at a certain curvature. The first side display area SDA1 may extend from the bottom side of the front display area FDA. The first side display area SDA1 may be an area arranged on the bottom side of the display panel 10.

The second side display area SDA2 may be an area extending from a second side of the front display area FDA and bent at a certain curvature. The second side display area SDA2 may extend from the right side of the front display area FDA. The second side display area SDA2 may be an area arranged on the right side of the display panel 10.

The third side display area SDA3 may be an area extending from a third side of the front display area FDA and bent at a certain curvature. The third side display area SDA3 may extend from the left side of the front display area FDA. The third side display area SDA3 may be an area arranged on the left side of the display panel 10.

The fourth side display area SDA4 may be an area extending from a fourth side of the front display area FDA and bent at a certain curvature. The fourth side display area SDA4 may extend from the top side of the front display area FDA. The fourth side display area SDA4 may be an area arranged on the top side of the display panel 10.

Each of the first side to fourth side display areas SDA1, SDA2, SDA3, and SDA4 may include a bent surface that has a predetermined curvature. For example, the first side display area SDA1 and the fourth side display area SDA4 may have curved surfaces bent about a bending axis extending in the x direction, and the second side display area SDA2 and the third side display area SDA3 may have curved surfaces bent about a bending axis extending in the y direction. The curvature of each of the first side to fourth side display areas SDA1, SDA2, SDA3, SDA4 may be the same or different from each other.

The corner display area CDA may be a curved area extending from a corner of the front display area FDA and that has a certain curvature. The corner display area CDA may be arranged between the first side display area SDA1 to fourth side display area SDA4. For example, the corner display area CDA may be arranged between the first side display area SDA1 and the second side display area SDA2, between the first side display area SDA1 and the third side display area SDA3, between the second side display area SDA2 and the fourth side display area SDA4, and between the third side display area SDA3 and the fourth side display area SDA4.

Since the corner display area CDA is between neighboring (or adjoining) side display areas SDA that have surfaces that curve in different directions, the corner display area CDA may include a continuous surface of curved surfaces bent in multiple directions to bridge the curvatures of the two adjoining side display areas SDA. In addition, if the curvature of each of the neighboring side display areas SDA is different, the curvature of the corner display area CDA may gradually change along the edge of the display apparatus 1. For example, if the curvature of the first side display area SDA1 and the curvature of the second side display area SDA2 are different, the corner display area CDA between the first side display area SDA1 and the second side display area SDA2 may have a curvature that gradually changes from the curvature of the first side display area SDA1 to the curvature of the second side display area SDA2 as a function of the position.

The display panel 10 may provide an image using the main pixels PXm arranged in the front display area FDA, the side pixels PXs arranged in the side display area SDA, and the corner pixels PXc arranged in the corner display area CDA. Since the display panel 10 provides images in the side display area SDA and the corner display area CDA in addition to the front display area FDA, the proportion of the display area of the display apparatus 1 may increase. In other words, for the same size of display apparatus 1, the area of the peripheral area PA may be reduced and the area of the display area may increase.

The peripheral area PA may be arranged to completely or partially surround the side display area SDA and the corner display area CDA. The peripheral area PA is an area where no image is displayed, and various wiring and drive circuits may be arranged. The peripheral area PA may be provided with a shield, such as a light-blocking member, to prevent the members arranged in the peripheral area PA from being visible.

Referring to FIG. 4, a cover window CW may be disposed on the front surface of the display panel 10. In this case, the "front surface" of the display panel 10 may be defined as the surface facing the direction in which the display panel 10 provides the image.

The cover window CW may serve to cover and protect the display panel 10. The cover window CW may have high transmittance to transmit light emitted from the display panel 10 and may have a low thickness to minimize the weight of the display apparatus 1 (e.g., refer to FIG. 2). In addition, the cover window CW may be strong and hard to protect the display panel 10 from external impact.

The cover window CW may be made of a transparent material. The cover window CW may include, for example, glass or plastic. If the cover window CW includes plastic, the cover window CW may be flexible. For example, the cover window CW may be ultra-thin glass (UTG®) that has been strengthened by methods such as chemical or thermal strengthening. In another embodiment, the cover window CW may be UTG® and colorless polyimide (CPI). In an embodiment, the cover window CW may have a structure with a flexible polymer layer arranged on one side of the glass substrate, or may consist solely of a polymer layer.

The cover window CW may include a flat surface portion FP corresponding to a front display area FDA of the display panel 10 and a curved surface portion CVP corresponding to a side display area SDA (e.g., refer to FIG. 3) and a corner display area CDA.

The flat surface portion FP of the cover window CW may be provided as a flat surface and overlap the front display area FDA of the display panel 10. The curved surface portion CVP of the cover window CW may be formed of a curved surface that may have a constant curvature or a varying curvature. The curved surface portion CVP may include a first curved surface portion CVP1 and a second curved surface portion CVP2. The first curved surface portion CVP1 may be arranged to overlap the side display area SDA and the corner display area CDA of the display panel 10. The second curved surface portion CVP2 may be arranged to overlap the peripheral area PA of the display panel 10. The first curved surface portion CVP1 may be arranged between the flat surface portion FP and the second curved surface portion CVP2.

A light-blocking member BM may be arranged in a portion of the second curved surface portion CVP2 of the cover window CW. The light-blocking member BM is intended to shade a substructure arranged on one side of it, and may be arranged to overlap the peripheral area PA of the display panel 10. The light-blocking member BM may include a light blocking material. The light-blocking member BM may be provided with a resin including carbon nanotubes, or a black dye (e.g., carbon black). Alternatively, the light-blocking member BM may be provided with nickel, aluminum, molybdenum, an alloy thereof, etc. The light-blocking member BM may be applied by inkjet or attached as a film type.

The display panel 10 may be disposed below the cover window CW. The cover window CW and the display panel 10 may be bonded together by an adhesive member (not shown). The adhesive member may be an optically clear adhesive (OCA) film or an optically clear resin (OCR) film.

The display panel 10 may have main pixels PXm arranged in the front display area FDA and corner pixels PXc arranged in the corner display area CDA to provide images. A lower protective film (not shown) may be additionally disposed below the display panel 10 to protect the display panel 10.

Figure 5:
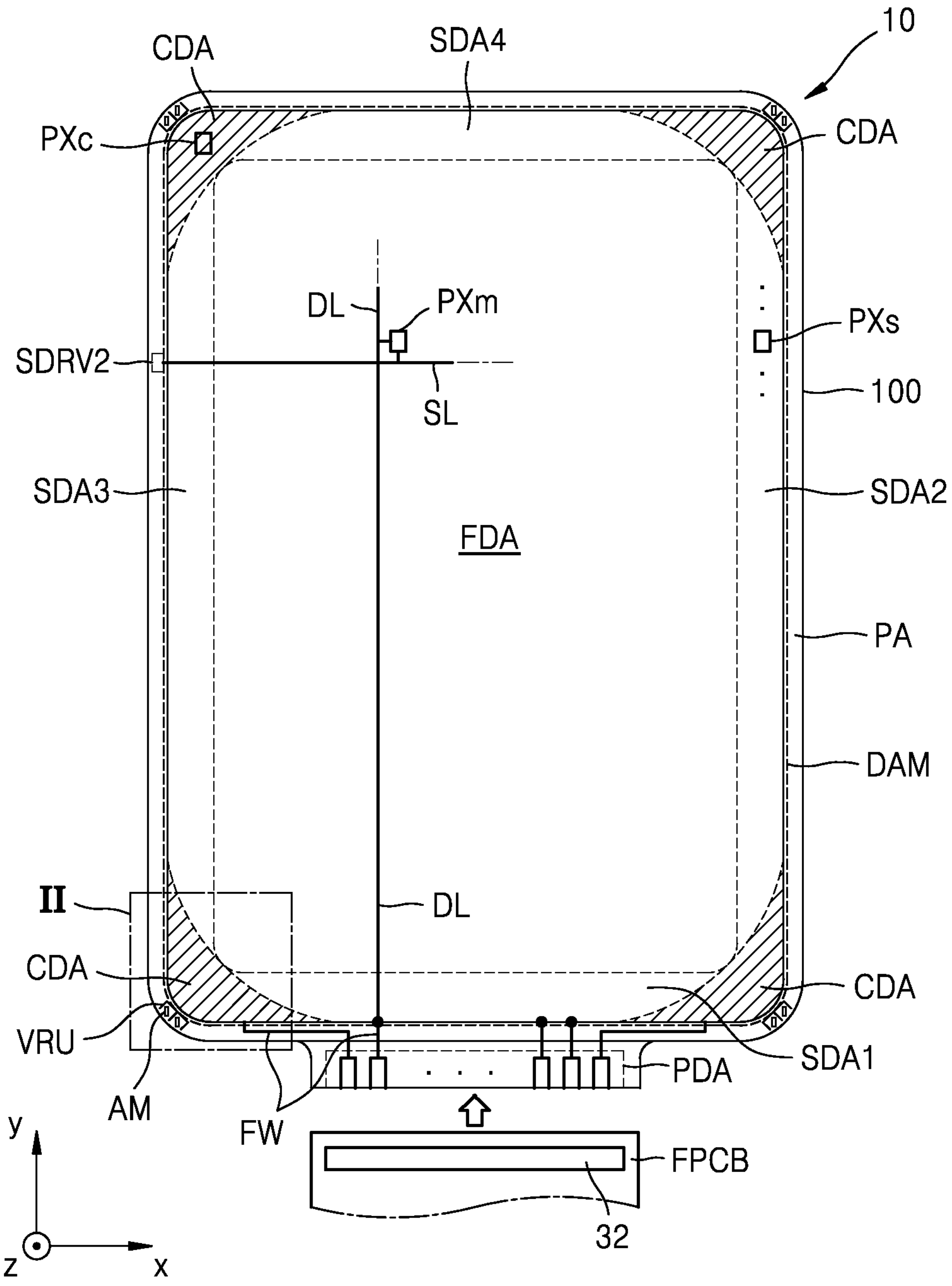
FIG. 5 is a schematic plan view illustrating a display panel that may be included in an unfolded state in the display apparatus of FIG. 1, according to an embodiment.
Figure 6:
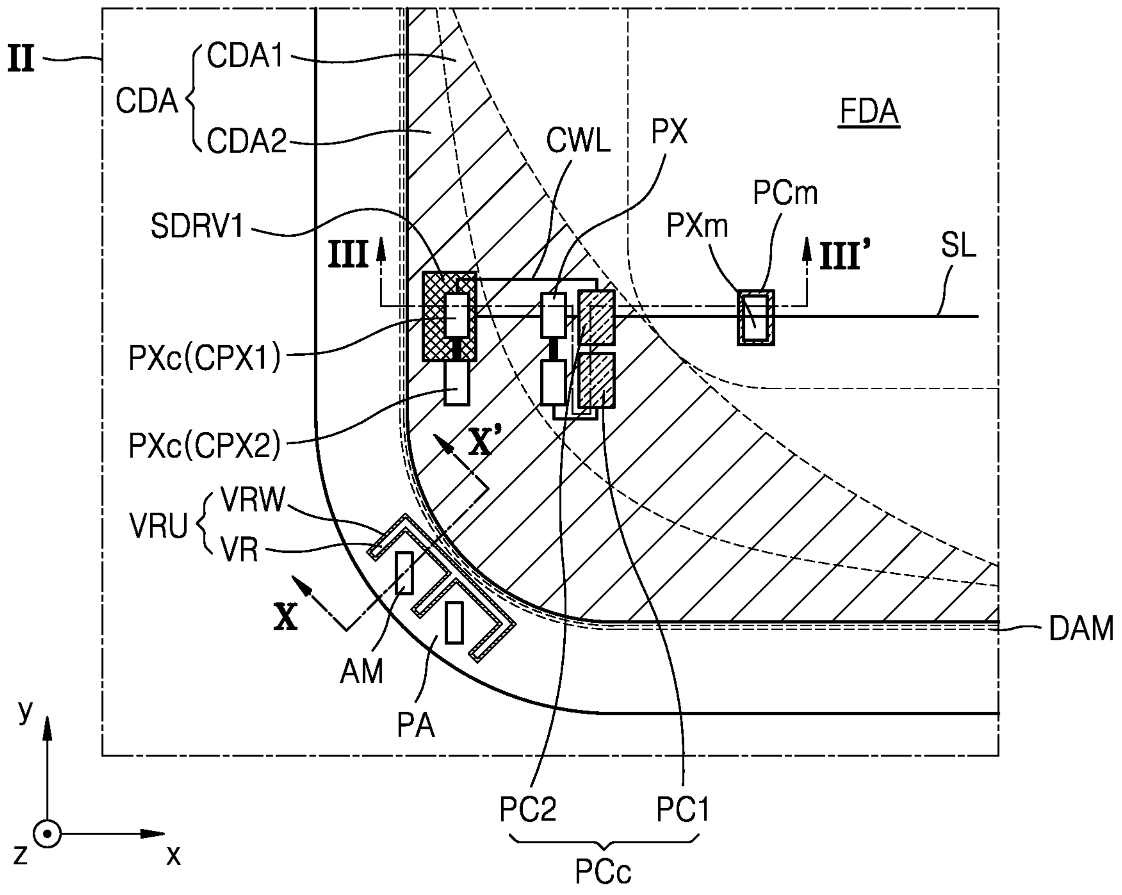
FIG. 6 is an enlarged view of a display panel of portion II of FIG. 5.

FIG. 5 is a schematic plan view illustrating a display panel that may be included in an unfolded state in the display apparatus of FIG. 1, according to an embodiment. FIG. 6 is an enlarged view of a display panel of portion II of FIG. 5.

Referring to FIG. 5 and FIG. 6, the various components including the display panel 10 are disposed on a substrate 100. The substrate 100 includes a front display area FDA, a side display area SDA, a corner display area CDA, and a peripheral area PA.

The front display area FDA includes a plurality of main pixels PXm by which a main image may be displayed. The main pixel PXm may be provided with a set of subpixels. Each subpixel may emit red, green, blue, or white light.

The side display area SDA may be arranged above, below, to the left, or to the right of the front display area FDA. The side display area SDA includes a plurality of side pixels PXs, by which a side image may be displayed. The side image may form a single overall image together with the main image, or the side image may be an independent image from the main image.

The corner display area CDA may be arranged in an area extending from a corner of the front display area FDA. The corner display area CDA may be arranged between two side display areas SDA. The corner display area CDA includes a plurality of corner pixels PXc, by which a corner image may be displayed. The corner image may form a single overall image together with the main image and the side image, or the corner image may be an independent image from the main image.

The corner display area CDA may include a first corner display area CDA1 and a second corner display area CDA2. The second corner display area CDA2 is an extension of the first corner display area CDA1, and the second corner display area CDA2 may be arranged closer to the edge of the substrate 100 than the first corner display area CDA1. The first corner display area CDA1 may be arranged between the second corner display area CDA2 and the front display area FDA.

In the second corner display area CDA2, a first scan drive circuit SDRV1 may be arranged in addition to the corner pixel PXc. The first scan drive circuit SDRV1 may provide a scan signal to drive the main pixel PXm and the corner pixels PXc arranged in the front display area FDA and the corner display area CDA. In some embodiments, the first scan drive circuit SDRV1 may simultaneously be connected to the pixel circuit (e.g., the corner pixel circuit PCc) driving the corner pixel PXc and the pixel circuit (e.g., the main pixel circuit PCm) driving the main pixel PXm to provide the same scan signal. In this case, the scan line SL connected to the first scan drive circuit SDRV1 may be arranged to extend from the second corner display area CDA2 to the front display area FDA. The scan line SL may extend in the x direction.

In the second corner display area CDA2, the corner pixel PXc may be arranged to overlap with the first scan drive circuit SDRV1. The corner pixel circuit PCc driving the corner pixel PXc arranged in the second corner display area CDA2 may be arranged in the first corner display area CDA1. Accordingly, pixel circuits PC1 and PC2 may be arranged in the first corner display area CDA1, the pixel circuits PC1 and PC2 respectively driving the corner pixel PXc arranged in the first corner display area CDA1 and the corner pixel PXc arranged in the second corner display area CDA2. The corner pixel PXc arranged in the second corner display area CDA2 may be driven by being connected to the pixel circuits PC1 and PC2 arranged in the first corner display area CDA1 through a connection wiring CWL. Such a connection wiring CWL may be provided extending in the x direction, which is the direction in which the scan line SL extends.

The corner pixels PXc arranged in the corner display area CDA may include a first copy pixel CPX1 and a second copy pixel CPX2. The first copy pixel CPX1 and the second copy pixel CPX2 may be driven by a single pixel circuit and may be pixels emitting the same color. The first copy pixel CPX1 and the second copy pixel CPX2 may be of substantially the same size. As the corner pixels PXc are provided as copy pixels, the number of pixel circuits driving the corner pixels PXc may be reduced and the corner display area CDA may be expanded since the corner pixels PXc are arranged to overlap with the first scan drive circuit SDRV1.

The peripheral area PA may be arranged on the outer side of the side display area SDA and the corner display area CDA. The peripheral area PA may be provided with various wires, a second scan drive circuit SDRV2, and a terminal block PDA.

The second scan drive circuit SDRV2 may provide a scan signal to drive the main pixels PXm and the side pixels PXs. The second scan drive circuit SDRV2 may be arranged on the right side of the second side display area SDA2 (not shown) and/or on the left side of the third side display area SDA3 and may be connected with a scan line SL extending in the x direction.

The terminal block PDA may be arranged on the bottom of the first side display area SDA1. The terminal block PDA is exposed and not covered by an insulation layer and is connected to a display circuit board FPCB. A display driver 32 may be arranged on the display circuit board FPCB.

The display driver 32 may generate a control signal to be transmitted to the scan drive circuits SDRV1, SDRV2. In addition, the display driver 32 may generate a data signal. The generated data signals may be delivered to the pixels PXm, PXs, PXc by the fan-out wiring FW and the data line DL connected to the fan-out wiring FW.

A valley unit VRU and an alignment mark AM may be disposed on the substrate 100. In this case, the valley unit VRU and alignment mark AM may be arranged in the peripheral area PA of the substrate 100. For example, the valley unit VRU and the alignment mark AM may be arranged in the peripheral area PA adjacent to at least one of the first side display area SDA1 to the fourth side display area SDA4, and the corner display area CDA.

The valley unit VRU may be arranged between the alignment mark AM and at least one of the first side display area SDA1 to the fourth side display area SDA4, and the corner display area CDA. In this case, the valley unit VRU may be arranged to wrap around at least a portion of the alignment mark AM in a plan view. In addition, the valley unit VRU may be provided with a space in which the alignment mark AM is arranged. By doing so, the valley unit VRU may reduce the need for another layer to be disposed on the alignment mark AM.

Hereinafter, for ease of explanation, a case in which the valley unit VRU and the alignment mark AM are arranged in the peripheral area PA adjacent to the corner display area CDA will be described in detail.

Figure 7:
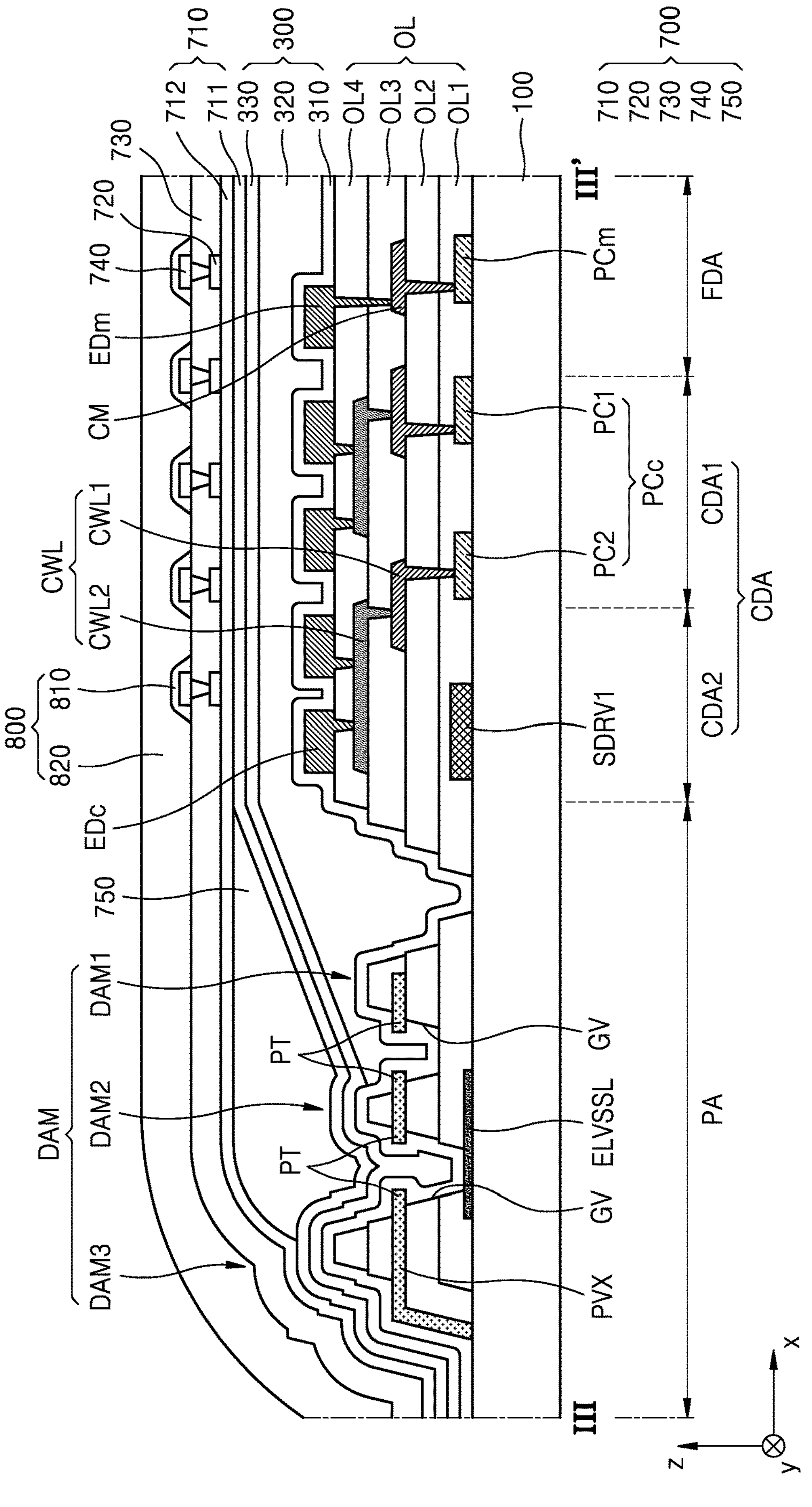
FIG. 7 is a cross-sectional view schematically illustrating a portion of a cross-section of a display panel according to an embodiment, the cross-section corresponding to line III-III' in FIG. 6.

FIG. 7 is a cross-sectional view schematically illustrating a portion of a cross-section of a display panel according to an embodiment, the cross-section corresponding to line III-III' in FIG. 6.

Referring to FIG. 7, the display panel 10 (e.g., refer to FIG. 5) includes a front display area FDA, a corner display area CDA, and a peripheral area PA, wherein the corner display area CDA may include a first corner display area CDA1 and a second corner display area CDA2.

The substrate 100 may be made of an insulation material such as glass, quartz, polymer resin, etc. The substrate 100 may be a rigid substrate or a flexible substrate that may be bent, folded, rolled, etc.

A display layer may be disposed on the substrate 100. In this case, the display layer may refer to a layer from the top surface of the substrate 100 to a thin-film encapsulation layer 300. For example, the display layer may refer to a buffer layer 111 (e.g., refer to FIG. 8) described below to the top layer (not shown), which is also described below. The display layer may include pixel circuits PCm and PCc including thin-film transistors, a first scan drive circuit SDRV1 that provides a scan signal to the pixel circuits PCm and PCc, and light emitting elements EDm and EDc respectively connected to the pixel circuits PCm and PCc to implement pixels PXm and PXc (refer to FIG. 6). In this case, the thin-film encapsulation layer 300, which covers and protects the light emitting elements EDm and EDc, may be disposed on the light emitting elements EDm and EDc, and a dam portion DAM may be disposed on the perimeter of the substrate 100. The pixel circuits PCm and PCc may include a main pixel circuit PCm and a corner pixel circuit PCc, and the corner pixel circuit PCc may include a first corner pixel circuit PC1 and a second corner pixel circuit PC2. In some embodiments, the main pixel circuit PCm, the first corner pixel circuit PC1, and the second corner pixel circuit PC2 may all be the same circuit. In another embodiment, the main pixel circuit PCm, the first corner pixel circuit PC1, and the second corner pixel circuit PC2 may be at least partially modified or different circuits.

An organic insulation layer OL may be arranged between the pixel circuits PCm and PCc and the light emitting elements EDm and EDc. The organic insulation layer OL may be provided with a plurality of organic insulation layers stacked on top of one another. In some embodiments, the organic insulation layer OL may be provided by stacking a first organic insulation layer OL1, a second organic insulation layer OL2, a third organic insulation layer OL3, and a fourth organic insulation layer OL4 on top of one another.

In the front display area FDA of the display panel 10, a main pixel circuit PCm and a main light emitting element EDm connected to the main pixel circuit PCm may be arranged. The light emitting area of the main light emitting element EDm may correspond to the main pixel PXm (refer to FIG. 6). The main pixel circuit PCm may include at least one thin-film transistor and may control the light emission of the main light emitting element EDm. The main light emitting element EDm may be connected to the main pixel circuit PCm by a connection electrode CM. The main light emitting element EDm may at least partially overlap the main pixel circuit PCm.

In the first corner display area CDA1 of the display panel 10, the first corner pixel circuit PC1 and the corner light emitting element EDc associated with the first corner pixel circuit PC1 may be arranged. The light emitting area of the corner light emitting element EDc may correspond to a corner pixel PXc (refer to FIG. 6). The first corner pixel circuit PC1 may include at least one thin-film transistor and may control the light emission of the at least two corner light emitting elements EDc. In an embodiment, the two corner light emitting elements EDc are connected to one first corner pixel circuit PC1 and may emit light simultaneously. In this case, the two corner light emitting elements EDc may implement a copy pixel.

A second corner pixel circuit PC2 connected to the corner light emitting element EDc arranged in the second corner display area CDA2 may be arranged in the first corner display area CDA1. The second corner pixel circuit PC2 may include at least one thin-film transistor and may control the light emission of the at least two corner light emitting elements EDc. In an embodiment, the two corner light emitting elements EDc are both connected to the second corner pixel circuit PC2 and may emit light simultaneously. In this case, the two corner light emitting elements EDc may implement a copy pixel.

The second corner pixel circuit PC2 may be connected to the corner light emitting element EDc arranged in the second corner display area CDA2 by a connection wiring CWL. The connection wiring CWL may include a first connection wiring CWL1 and a second connection wiring CWL2 disposed on different layers. The connection relationship may be modified in various ways, the second corner pixel circuit PC2 may be connected to the corner light emitting element EDc only by the first connection wiring CWL1, or may be connected to the corner light emitting element EDc only by the second connection wiring CWL2, or may be connected to the corner light emitting element EDc by the first connection wiring CWL1 and the second connection wiring CWL2, etc.

A first scan drive circuit SDRV1 may be arranged in the second corner display area CDA2 of the display panel 10. The first scan drive circuit SDRV1 includes at least one thin-film transistor and may provide a scan signal to the corner pixel circuit PCc and the main pixel circuit PCm arranged in the corner display area CDA (e.g., the first corner display area CDA1) and the front display area FDA. In the second corner display area CDA2, a light emission control drive circuit (not shown) that provides a light emission control signal in addition to the scan signal may be additionally arranged. The first scan drive circuit SDRV1 and the light emission control drive circuit may overlap with the corner light emitting element EDc.

The light emitting areas of the corner light emitting elements EDc arranged in the first corner display area CDA1 and the second corner display area CDA2 represent corner pixels (e.g., corner pixels PXc in FIG. 3), and the corner pixels may be arranged in the same pixel arrangement in the first corner display area CDA1 and the second corner display area CDA2.

The main light emitting element EDm and the corner light emitting element EDc may be covered by the thin-film encapsulation layer 300. In some embodiments, the thin-film encapsulation layer 300 may include at least one inorganic encapsulation layer and at least one organic encapsulation layer. In an embodiment, the thin-film encapsulation layer 300 may include a first inorganic encapsulation layer 310 and a second inorganic encapsulation layer 330 and an organic encapsulation layer 320 between.

In the peripheral area PA of the display panel 10, a common voltage line ELVSSL that transmits a common voltage to the light emitting elements and a dam portion DAM may be arranged. The dam portion DAM may be provided overlapped with the common voltage line ELVSSL. The dam portion DAM may be intended to prevent the flow of the material forming the organic encapsulation layer 320 of the thin-film encapsulation layer 300 and prevent permeation of external moisture.

The dam portion DAM may include a plurality of dams. The dam portion DAM may include a first dam DAM1, a second dam DAM2, and a third dam DAM3. A concave groove GV may be formed between the plurality of dams. The plurality of dams may be provided with a plurality of organic insulation layers OL stacked on top of one another. A first dam DAM1 and a second dam DAM2 may each be provided by stacking a first organic insulation layer OL1, a second organic insulation layer OL2, and a third organic insulation layer OL3.

In the present embodiment, each of the first dam DAM1 and the second dam DAM2 may further be provided with an inorganic layer PVX disposed between the second organic insulation layer OL2 and the third organic insulation layer OL3. Such an inorganic layer PVX may have a protruding tip PT protruding into the groove GV arranged between the first dam DAM1 and the second dam DAM2. By disconnecting the organic layer or counter electrode included in the light emitting element by the protruding tip PT, the tolerance margin required for depositing the organic layer or counter electrode may be reduced, thereby dramatically reducing the area of the peripheral area PA.

In the present embodiment, a third dam DAM3 may be provided by sequentially disposing a first organic insulation layer OL1, a second organic insulation layer OL2, a third organic insulation layer OL3, and a fourth organic insulation layer OL4. The third dam DAM3 may further be provided with an inorganic layer PVX disposed between the second organic insulation layer OL2 and the third organic insulation layer OL3. The inorganic layer PVX may cover the sides of the third dam DAM3 adjacent thereto. That is, the inorganic layer PVX may be provided to cover one side of the second organic insulation layer OL2, which is the second layer of the third dam DAM3. The inorganic layer PVX may extend from one side of the second organic insulation layer OL2 to a top surface of the substrate 100. Accordingly, the first inorganic encapsulation layer 310 of the thin-film encapsulation layer 300 may contact the inorganic layer PVX on a side of the third dam DAM3. The second inorganic encapsulation layer 330 may also contact the first inorganic encapsulation layer 310 on the side of the third dam DAM3.

In addition, the first inorganic encapsulation layer 310 may clad the edge of the inorganic layer PVX on the top surface of the substrate 100, and the second inorganic encapsulation layer 330 may clad the edge of the first inorganic encapsulation layer 310 on the top surface of the substrate 100. By such a structure, air may be effectively prevented from infiltrating into the display area. In addition, the area of the peripheral area PA may be significantly reduced since the first inorganic encapsulation layer 310, the second inorganic encapsulation layer 330, and the inorganic layer PVX are in contact on the side of the third dam DAM3. By reducing the area of the peripheral area PA, the area of the second corner display area CDA2 may increase, which may in turn increase the area of the display area of the display apparatus 1 (e.g., refer to FIG. 2).

The display panel 10 may include an input sensing layer 700 and an optical function layer 800 disposed on the thin-film encapsulation layer 300.

The input sensing layer 700 may have a multi-layer structure. The input sensing layer 700 includes a sensing electrode, a trace line connected to the sensing electrode, and at least one insulation layer. The input sensing layer 700, for example, may detect external inputs using a capacitive method. The manner of operation of the input sensing layer 700 is not particularly limited in the disclosure, and according to an embodiment, the input sensing layer 700 may sense the external input in an electromagnetic inductive manner or a pressure sensitive manner.

The input sensing layer 700 may include a first inorganic insulation layer 710, a first conductive layer 720, a second inorganic insulation layer 730, a second conductive layer 740, and a planarized layer 750.

Each of the first conductive layer 720 and the second conductive layer 740 may have a single-layer structure or a stacked multi-layer structure. The conductive layer of the single-layer structure may include a metal layer or a transparent conductive layer. The metal layer may include molybdenum, silver, titanium, copper, aluminum, and alloys thereof. The transparent conductive layer may include transparent conductive oxides such as indium tin oxide (ITO), indium zinc oxide (IZO), zinc oxide (ZnO), indium tin zinc oxide (ITZO), etc. Other transparent conductive layers may include conductive polymers such as a poly(3,4-ethylenedioxythiophene) (PEDOT), a metal nanowire, graphene, etc.

The conductive layer of the multi-layer structure may include multi-layered metal layers. The multi-layered metal layers may have a three-layer structure, for example, Ti/Al/Ti. The conductive layer of the multi-layer structure may include at least one metal layer and at least one transparent conductive layer.

Each of the first conductive layer 720 and the second conductive layer 740 includes a plurality of patterns. Hereinafter, it may be understood that the first conductive layer 720 includes a first conductive patterns and the second conductive layer 740 includes a second conductive patterns. The first conductive patterns and the second conductive patterns may form the sensing electrode. In an embodiment, the sensing electrode may have a mesh shape to prevent the sensing electrode from being visible to a user.

Each of the first inorganic insulation layer 710 and the second inorganic insulation layer 730 may have a single-layer or multi-layer structure. Each of the first inorganic insulation layer 710 and the second inorganic insulation layer 730 may include an inorganic material or a composite material. For example, at least one of the first inorganic insulation layer 710 and the second inorganic insulation layer 730 may include an inorganic film. The inorganic film may include at least one of aluminum oxide, titanium oxide, silicon oxide, silicon oxynitride, zirconium oxide, and hafnium oxide. In another embodiment, the first inorganic insulation layer 710 and/or the second inorganic insulation layer 730 may be replaced by an organic insulation layer. Hereinafter, for ease of explanation, a case in which the first inorganic insulation layer 710 is a multi-layer structure including a 1-1st inorganic insulation layer 711 and a 1-2nd inorganic insulation layer 712 will be described in detail.

The 1-1st inorganic insulation layer 711 and the 1-2nd inorganic insulation layer 712 as described above may be stacked in the display area. In addition, a planarized layer 750 may be disposed between the 1-1st inorganic insulation layer 711 and the 1-2nd inorganic insulation layer 712 arranged in the peripheral area PA. The planarized layer 750 may be arranged in the peripheral area PA. The planarized layer 750 may be an organic insulation layer. The planarized layer 750 may include a polymer-based material. For example, the planarized layer 750 may include a silicone-based resin, an acrylic-based resin, an epoxy-based resin, a polyimide, a polyethylene, etc. The aforementioned polymer-based material may be transparent. In an embodiment, the planarized layer 750 may include a different material than the organic encapsulation layer 320. For example, the organic encapsulation layer 320 may include a silicone-based resin and the planarized layer 750 may include an acrylic-based resin. In another embodiment, the organic encapsulation layer 320 and the planarized layer 750 may include the same material.

The optical function layer 800 may be directly disposed on the input sensing layer 700. The optical function layer 800 may include a first layer 810 and a second layer 820 on the first layer 810. The first layer 810 and the second layer 820 may include an organic insulation material and may be provided to have different refractive indexes. In an embodiment, the refractive index of the second layer 820 may be greater than the refractive index of the first layer 810. For example, the refractive index of the first layer 810 may range from about 1.3 to about 1.6. In some embodiments, the refractive index of the first layer 810 may range from about 1.4 to about 1.55. The first layer 810 may be provided with an acrylic organic material that has a refractive index between about 1.4 to about 1.55. The first layer 810 may be provided with an acrylic-based resin (for example, polymethylmethacrylate, polyacrylic acid, etc.), ethylhexyl acrylate, pentafluoropropyl acrylate, poly(ethylene glycol) dimethacrylate, or ethylene glycol dimethacrylate, etc. In some embodiments, the first layer 810 may further include a heat curing agent such as an epoxy-based resin and/or a photo curing agent.

The second layer 820 may have a refractive index in a range of about 1.65 to about 1.85. The second layer 820 may include an acrylic-based, siloxane-based organic material. In some embodiments, the second layer 820 may include polydiarylsiloxane, methyltrimethoxysilane, or tetramethoxysilane, etc. In some embodiments, second layer 820 may include dispersed particles for a high refractive index. For example, metal oxide particles such as zinc oxide ($ZnO_x$, such as $ZnO_2$ or ZnO), titanium oxide ($TiO_2$), zirconium oxide ($ZrO_2$), barium titanate ($BaTiO_3$), etc. may be dispersed in the second layer 820. The second layer 820 may be formed by applying an organic material containing metal oxide particles using an inkjet.

Figure 8:
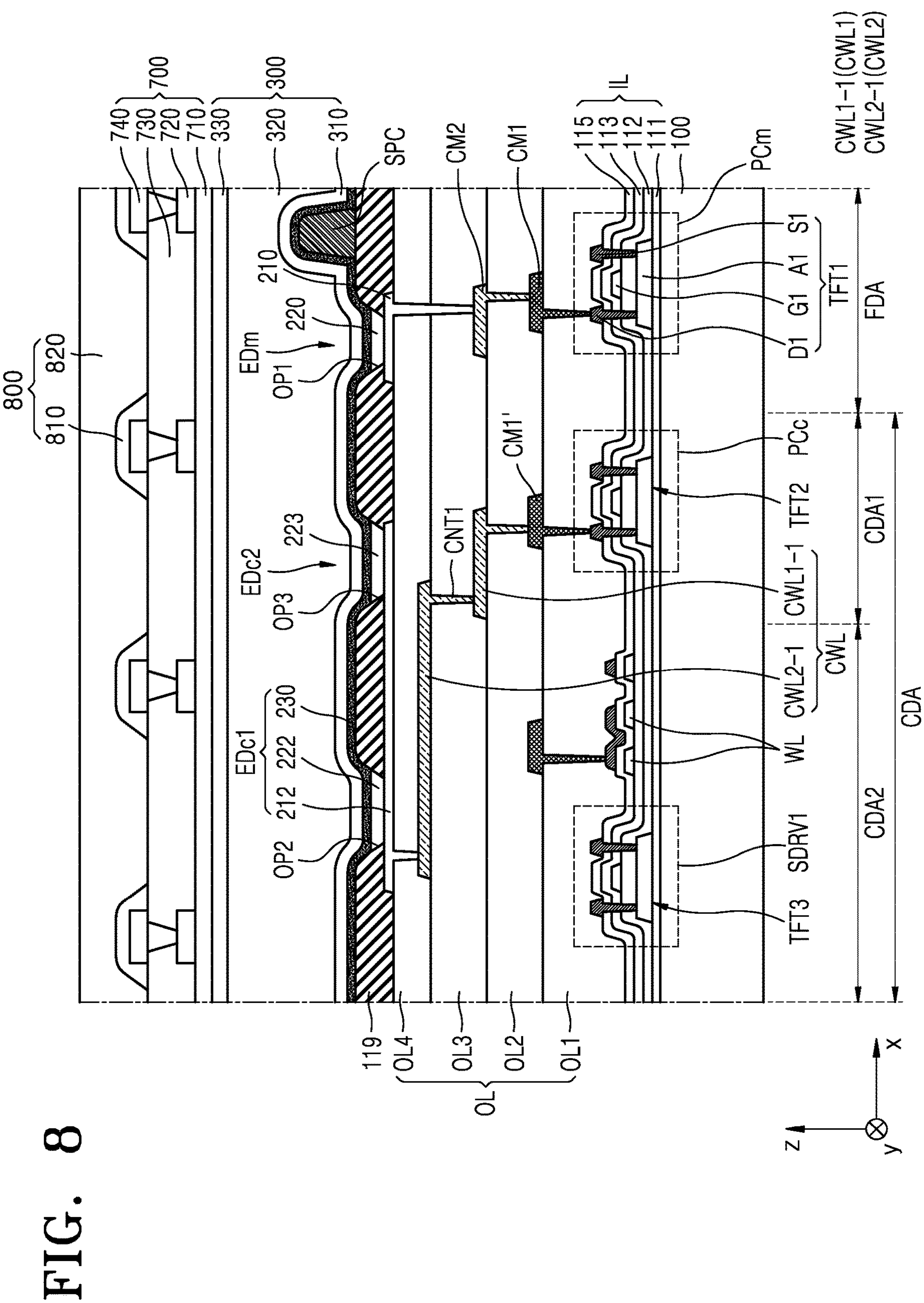
FIG. 8 is a cross-sectional view schematically illustrating a portion of a cross-section of a display panel according to an embodiment.

FIG. 8 is a cross-sectional view schematically illustrating a portion of a cross-section of a display panel according to an embodiment. Specifically, FIG. 8 illustrates a front display area FDA and a portion of a corner display area CDA of the display panel.

Referring to FIG. 8, in the front display area FDA, a main light emitting element EDm and a main pixel circuit PCm connected to the main light emitting element EDm may be arranged. In the corner display area CDA, corner light emitting elements EDc1 and EDc2 may be arranged as corner light emitting elements. The corner light emitting elements EDc1 and EDc2 may include a first corner light emitting element EDc1 and a second corner light emitting element EDc2 connected to each other. The main light emitting element EDm and the corner light emitting elements EDc1 and EDc2 may be provided with organic light emitting diodes.

In the first corner display area CDA1 of the corner display area CDA, a corner pixel circuit PCc connected to the corner light emitting elements EDc1 and EDc2 may be arranged. In the second corner display area CDA2, a first scan drive circuit SDRV1 that provides a drive signal such as a scan signal to the pixel circuits PCm and PCc may be arranged. The main pixel circuit PCm may include a first thin-film transistor TFT1, the corner pixel circuit PCc may include a second thin-film transistor TFT2, and the first scan drive circuit SDRV1 may include a third thin-film transistor TFT3.

In the first corner display area CDA1 and the second corner display area CDA2, a connection wiring CWL connecting the corner pixel circuit PCc and the corner light emitting elements EDc1 and EDc2 may be arranged. The connection wiring CWL may include a first connection wiring CWL1 and a second connection wiring CWL2 disposed on different layers.

The substrate 100 may be made of an insulation material such as glass, quartz, polymer resin, etc. The substrate 100 may be a rigid substrate or a flexible substrate that may be bent, folded, rolled, etc.

A buffer layer 111 may be located on the substrate 100, which may reduce or block the infiltration of debris, moisture, or external air from the lower portion of the substrate 100, and may provide a flat surface on the substrate 100. The buffer layer 111 may include an inorganic material, such as an oxide or nitride, or an organic material, or an organic-inorganic composite, and may include a single-layer or multi-layer structure of inorganic material and organic material. Between the substrate 100 and the buffer layer 111, a barrier layer (not shown) may further be included to block the infiltration of external air. In some embodiments, the buffer layer 111 may be provided with silicon oxide ($SiO_2$) or silicon nitride ($SiN_x$).

On top of the buffer layer 111, a first thin-film transistor TFT1, a second thin-film transistor TFT2, and a third thin-film transistor TFT3 may be disposed. The first thin-film transistor TFT1 includes a first semiconductor layer A1, a first gate electrode G1, a first source electrode S1, and a first drain electrode D1. The first thin-film transistor TFT1 is connected to the main light emitting element EDm and may drive the main light emitting element EDm. The second thin-film transistor TFT2 may be connected to the corner light emitting elements EDc1 and EDc2 to drive the corner light emitting elements EDc1 and EDc2. The third thin-film transistor TFT3 is a thin-film transistor included in the first scan drive circuit SDRV1 and may provide a drive signal such as a scan signal.

The second thin-film transistor TFT2 and the third thin-film transistor TFT3 have a similar configuration to the first thin-film transistor TFT1, and the description of the second thin-film transistor TFT2 and the third thin-film transistor TFT3 may be replaced by the description of the first thin-film transistor TFT1. The first thin-film transistor TFT1 may include a first semiconductor layer A1, a first gate electrode G1, a first source electrode S1, and a first drain electrode D1.

The first semiconductor layer A1 is disposed on the buffer layer 111 and may include polysilicon. In another embodiment, the first semiconductor layer A1 may include amorphous silicon. In another embodiment, the first semiconductor layer A1 may include an oxide of at least one material selected from the group consisting of indium (In), gallium (Ga), stannium (Sn), zirconium (Zr), vanadium (V), hafnium (Hf), cadmium (Cd), germanium (Ge), chromium (Cr), titanium (Ti), and zinc (Zn). The first semiconductor layer A1 may include a channel area and an impurity-doped source area and a drain area.

A first gate insulation layer 112 may be provided to cover the first semiconductor layer A1. The first gate insulation layer 112 may include an inorganic insulation material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), etc. The first gate insulation layer 112 may be a single-layer or a multi-layer including any of the aforementioned inorganic insulation materials.

On top of the first gate insulation layer 112, a first gate electrode G1 is disposed to overlap the first semiconductor layer A1. The first gate electrode G1 includes molybdenum (Mo), aluminum (Al), copper (Cu), titanium (Ti), etc., and may be a single-layer or a multi-layer. In one example, the first gate electrode G1 may be a single Mo layer.

The second gate insulation layer 113 may be provided to cover the first gate electrode G1. The second gate insulation layer 113 may include an inorganic insulation material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate insulation layer 113 may be a single-layer or a multi-layer including any of the aforementioned inorganic insulation materials.

On top of the second gate insulation layer 113, the lines WL and capacitor electrodes (not shown) may be disposed. Some of the lines WL arranged in the second corner display area CDA2 may be connected to the first scan drive circuit SDRV1 to transmit drive signals. The lines WL may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may be a single-layer or a multi-layer of the aforementioned materials.

The interlayer insulation layer 115 may be formed to cover the lines WL on the second gate insulation layer 113. The interlayer insulation layer 115 may include an inorganic insulation material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$). The interlayer insulation layer 115 may be a single-layer or a multi-layer including any of the aforementioned inorganic insulation materials.

The first source electrode S1 and the first drain electrode D1 may be disposed on the interlayer insulation layer 115. The first source electrode S1 and the first drain electrode D1 may include a conductive material including molybdenum (Mo), aluminum (Al), copper (Cu), titanium (Ti), etc., and may be formed as a multi-layer or a single-layer including the above conductive materials. In one example, the first source electrode S1 and the first drain electrode D1 may be made of a multi-layer structure of Ti/Al/Ti.

On top of the interlayer insulation layer 115, a first organic insulation layer OL1 may be disposed to cover the first source electrode S1 and the first drain electrode D1. On the first organic insulation layer OL1, first connection electrodes CM1 and CM1' that are respectively connected to the pixel circuits PCm and PCc may be disposed. The first connection electrodes CM1 and CM1' may include a conductive material including molybdenum (Mo), aluminum (Al), copper (Cu), titanium (Ti), etc., and may be formed as a multi-layer or a single-layer including the above conductive materials.

The buffer layer 111, the first gate insulation layer 112, the second gate insulation layer 113, and the interlayer insulation layer 115 may be collectively referred to as the inorganic insulation layer IL. The inorganic insulation layer IL may be disposed between the substrate 100 and the light emitting elements EDm, EDc1, and EDc2, or between the substrate 100 and an organic insulation layer OL.

On top of the first organic insulation layer OL1, a second organic insulation layer OL2 that covers the first connection electrodes CM1 and CM1' may be disposed. On the second organic insulation layer OL2, the first connection wirings CWL1 and the second connection electrode CM2 may be disposed. The first connection wirings CWL1 may be connected to the first connection electrode CM1' connected to the corner pixel circuit PCc, and the second connection electrode CM2 may be connected to the first connection electrode CM1 connected to the main pixel circuit PCm.

The first connection wirings CWL1 and the second connection electrode CM2 may include a conductive material including molybdenum (Mo), aluminum (Al), copper (Cu), titanium (Ti), etc., and may be formed as a multi-layer or a single-layer including the above conductive materials. Alternatively, the first connection wirings CWL1 and the second connection electrode CM2 may be provided with a transparent conductive material. For example, the first connection wirings CWL1 and the second connection electrode CM2 may be provided with a transparent conducting oxide (TCO). The first connection wirings CWL1 and the second connection electrode CM2 may include indium tin oxide (ITO), indium zinc oxide (IZO), zinc oxide (ZnO), indium oxide ($In_2O_3$), indium gallium oxide (IGO), or conductive oxides such as aluminum zinc oxide (AZO).

On top of the second organic insulation layer OL2, a third organic insulation layer OL3 that covers the first connection wirings CWL1, may be disposed. On top of the third organic insulation layer OL3, a second connection wiring CWL2 may be disposed. Among the second connection wirings CWL2, a 2-1st connection wiring CWL2-1 may be connected to the a 1-1st connection wiring CWL1-1, one of the first connection wirings CWL1, through a contact hole CNT1 through the third organic insulation layer OL3.

The second connection wirings CWL2 may include a conductive material including molybdenum (Mo), aluminum (Al), copper (Cu), titanium (Ti), etc., and may be formed as a multi-layer or a single-layer including the above conductive materials. Alternatively, the second connection wirings CWL2 may be provided with a transparent conductive material. For example, the second connection wirings CWL2 may be provided with a transparent conducting oxide (TCO). Second connection wirings CWL2 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

At least one of the first connection wirings CWL1 and the second connection wirings CWL2 may be arranged to extend from the first corner display area CDA1 to the second corner display area CDA2. Accordingly, at least one of the first connection wirings CWL1 and the second connection wirings CWL2 may overlap the first scan drive circuit SDRV1.

On top of the third organic insulation layer OL3, a fourth organic insulation layer OL4 may be disposed to cover the second connection wirings CWL2. The fourth organic insulation layer OL4 may have a flat top surface so that the first pixel electrode 210 and the second pixel electrode 212 disposed on the fourth organic insulation layer OL4 may be formed flat.

The first organic insulation layer OL1, second organic insulation layer OL2, third organic insulation layer OL3, and fourth organic insulation layer OL4 may include a general purpose polymer such as polystyrene, benzocyclobutene (BCB), polyimide, hexamethyldisiloxane (HMDSO), polymethylmethacrylate (PMMA), Polymer derivatives that has phenolic groups, acrylic polymers, imide polymers, aryl ether polymers, amide polymers, fluorinated polymers, p-xylene polymers, or vinyl alcohol polymers, etc. The first organic insulation layer OL1, second organic insulation layer OL2, third organic insulation layer OL3, and fourth organic insulation layer OL4 may be provided with the same material or different material, and various modifications are possible.

On the fourth organic insulation layer OL4, light emitting elements EDm, EDc1, and EDc2 may be disposed. The main light emitting element EDm may be provided with a first pixel electrode 210, a first emission layer 220, and a counter electrode 230. The first corner light emitting element EDc1 may be provided with a second pixel electrode 212, a second emission layer 222, and a counter electrode 230, and the second corner light emitting element EDc2 may be provided with a second pixel electrode 212, a third emission layer 223, and a counter electrode 230. The first corner light emitting element EDc1 and the second corner light emitting element EDc2 may share the second pixel electrode 212.

The first pixel electrode 210 and the second pixel electrode 212 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The first pixel electrode 210 and the second pixel electrode 212 may include a reflective film including silver (Ag), magnesium (Mg), aluminum (Al), platinum (Pt), palladium (Pd), gold (Au), nickel (Ni), neodymium (Nd), iridium (Ir), chromium (Cr), or compounds thereof. For example, the first pixel electrode 210 and the second pixel electrode 212 may have a structure with films formed of ITO, IZO, ZnO, or $In_2O_3$ above/below the aforementioned reflective film. In this case, the first pixel electrode 210 and the second pixel electrode 212 may have a stacked structure of ITO/Ag/ITO.

The pixel defining film 119 is disposed on the fourth organic insulation layer OL4 and may define the light emitting area of the light emitting elements EDm, EDc1, and EDc2. The pixel defining film 119 covers the edge of the first pixel electrode 210 and may be provided with a first opening OP1 exposing the center of the first pixel electrode 210. The size and shape of the light emitting area of the main light emitting element EDm may be defined by the first opening OP1.

The pixel defining film 119 covers the edge of the second pixel electrode 212 and may include a second opening OP2 and a third opening OP3 which exposes two areas of the center of the second pixel electrode 212. The second opening OP2 may define a light emitting area of the first corner light emitting element EDc1 and the third opening OP3 may define a light emitting area of the second corner light emitting element EDc2. In some embodiments, the second opening OP2 and the third opening OP3 may be provided with the same size and shape.

The pixel defining film 119 may serve to prevent arc from occurring at the edges of the pixel electrodes 210 and 212 by increasing the distance between the edges of the pixel electrodes 210 and 212 and the counter electrode 230 disposed on the pixel electrodes 210 and 212. The pixel defining film 119 may be formed of an organic insulation material such as polyimide, polyamide, acrylic-based resin, benzocyclobutene, hexamethyldisiloxane (HMDSO), and phenol resin, etc. by a method such as spin coating, etc.

A spacer SPC may be disposed on the top surface of the pixel defining film 119. The spacer SPC may be provided to prevent the mask from being stamped during the manufacturing process. The spacer SPC may be formed of an organic insulation material such as polyimide, polyamide, acrylic-based resin, benzocyclobutene, hexamethyldisiloxane (HMDSO), and phenol resin, etc. by a method such as spin coating, etc.

A first emission layer 220, a second emission layer 222, and a third emission layer 223 may be arranged inside the first opening OP1, the second opening OP2, and the third opening OP3 of the pixel defining film 119, respectively. The first emission layer 220, the second emission layer 222, and the third emission layer 223 may each include a high molecular weight material or a low molecular weight material, and may each emit red, green, blue, or white light. In an embodiment, the second emission layer 222 and the third emission layer 223 may be provided as having the same material and may emit the same color of light.

An organic function layer (not shown) may be disposed above/below the first emission layer 220, second emission layer 222, and third emission layer 223. The organic function layer of the first emission layer 220, the second emission layer 222, and the third emission layer 223 may include a hole injection layer (HIL), a hole transport layer (HTL), an electron transport layer (ETL), and/or an electron injection layer (EIL). The organic function layer may be integrally formed to correspond to the light emitting elements included in the front display area FDA and the corner display area CDA.

A counter electrode 230 may be disposed on the first emission layer 220, second emission layer 222, and third emission layer 223. The counter electrode 230 may include a low work-function conductive material. For example, counter electrode 230 may include a (semi-) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the counter electrode 230 may further include a layer such as ITO, IZO, ZnO, or $In_2O_3$ on the (semi-)transparent layer including the aforementioned materials. A counter electrode 230 may be integrally formed to correspond to the front display area FDA included in the main display area MDA and the light emitting elements EDm, EDc1, and EDc2 included in the corner display area CDA.

A top layer (not shown) including an organic material may be formed on the counter electrode 230. The top layer may be provided to protect the counter electrode 230, in which a light extraction efficiency is increased. The top layer (not shown) may include an organic material with a higher refractive index than the counter electrode 230. Alternatively, the top layer (not shown) may include layers having different refractive indices. For example, the top layer (not shown) may include a stack of high refractive index layer/low refractive index layer/high refractive index layers. In this case, the high refractive index layer may have a refractive index of 1.7 or greater, and the low refractive index layer may have a refractive index of 1.3 or less.

The top layer may additionally include lithium fluoride (LiF). Alternatively, the top layer may additionally include an inorganic insulation material such as silicon oxide ($SiO_2$) or silicon nitride ($SiN_x$).

The light emitting elements EDm, EDc1, and EDc2 may be covered and protected by a thin-film encapsulation layer 300. The thin-film encapsulation layer 300 may include at least one organic encapsulation layer and at least one inorganic encapsulation layer. FIG. 8 illustrates that the thin-film encapsulation layer 300 includes a first inorganic encapsulation layer 310 and a second inorganic encapsulation layer 330 and an organic encapsulation layer 320 arranged therebetween. In another embodiment, the number of organic encapsulation layer and inorganic encapsulation layer and the stacking order may be changed.

The first inorganic encapsulation layer 310 and the second inorganic encapsulation layer 330 may each include one or more inorganic insulation materials, such as silicon oxide ($SiO_2$), silicon nitride ($SiN_x$), silicon oxynitride ($SiO_xN_y$), and may be formed by chemical vapor deposition (CVD), etc. The organic encapsulation layer 320 may include a material of the polymer family. Materials of the polymer family may include acrylic-based resins, epoxy-based resins, polyimides, and polyethylene, etc.

In the present embodiment, a corner pixel circuit PCc is arranged in the first corner display area CDA1, and at least two corner light emitting elements EDc1 and EDc2 may be connected to the corner pixel circuit PCc. For example, one corner pixel circuit PCc may be connected with a first corner light emitting element EDc1 and a second corner light emitting element EDc2. The drawings (e.g., FIG. 8) show one corner pixel circuit PCc connected with two corner light emitting elements EDc1 and EDc2, but the disclosure is not limited thereto. Various modifications are possible, such as one corner pixel circuit PCc connected to three or four corner light emitting elements.

The corner pixel circuit PCc may be connected to the corner organic light emitting elements EDc1 and EDc2 by a connection wiring CWL extending from the first corner display area CDA1 to the second corner display area CDA2. The connection wiring CWL may include a first connection wiring CWL1 arranged on a second organic insulation layer OL2 and a second connection wiring CWL2 disposed on a third organic insulation layer OL3.

Among the second connection wirings CWL2, a 2-1st connection wiring CWL2-1 may be connected to the a 1-1st connection wiring CWL1-1, through a contact hole CNT1 through the third organic insulation layer OL3. The 1-1st connection wiring CWL1-1 is connected to the first connection electrode CM1' connected to the corner pixel circuit PCc through the contact hole, and the 2-1st connection wiring CWL2-1 is connected to the second pixel electrode 212 through the contact hole, so that the corner pixel circuit PCc may be connected to the corner light emitting elements EDc1 and EDc2.

Figure 9:
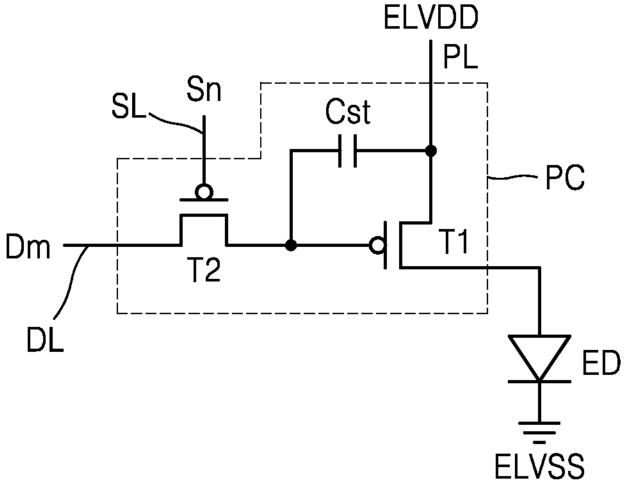
FIG. 9 is an equivalent circuit diagram of a pixel circuit that may be applied to a display panel according to an embodiment.

FIG. 9 is an equivalent circuit diagram of a pixel circuit that may be applied to a display panel according to an embodiment.

Referring to FIG. 9, the pixel circuit PC may be connected with the light emitting element ED to control light emission of the (sub) pixels. The pixel circuit PC may include a drive thin-film transistor T1, a switching thin-film transistor T2, and a storage capacitor Cst. The switching thin-film transistor T2 is connected to the scan line SL and the data line DL, and transmits the data signal Dm input through the data line DL to the drive thin-film transistor T1 according to the scan signal Sn input through the scan line SL.

The storage capacitor Cst is connected to the switching thin-film transistor T2 and the drive voltage line PL, and stores a voltage corresponding to the difference between the voltage received from the switching thin-film transistor T2 and the drive voltage ELVDD supplied to the drive voltage line PL.

The drive thin-film transistor T1 is connected to the drive voltage line PL and the storage capacitor Cst, and may control the drive current flowing from the drive voltage line PL to the light emitting element ED in response to the voltage stored in the storage capacitor Cst. The light emitting element ED may emit light that has a certain luminance by the driving current.

FIG. 9 illustrates a case where the pixel circuit PC includes two thin-film transistors and one storage capacitor, but the disclosure is not limited thereto. Various modifications are possible, such as the pixel circuit PC may include three to nine thin-film transistors and one to two capacitors. In conjunction with FIG. 8, the pixel circuit PC may be equally applicable to the main pixel circuit PCm and the corner pixel circuit PCc, with some modifications in configuration. For example, the storage capacitor included in the main pixel circuit PCm may have a different capacity than the storage capacitor included in the corner pixel circuit PCc. Alternatively, the number of thin-film transistors included in the main pixel circuit PCm and the number of thin-film transistors included in the corner pixel circuit PCc may be provided differently, and various other modifications are possible.

Figure 10:
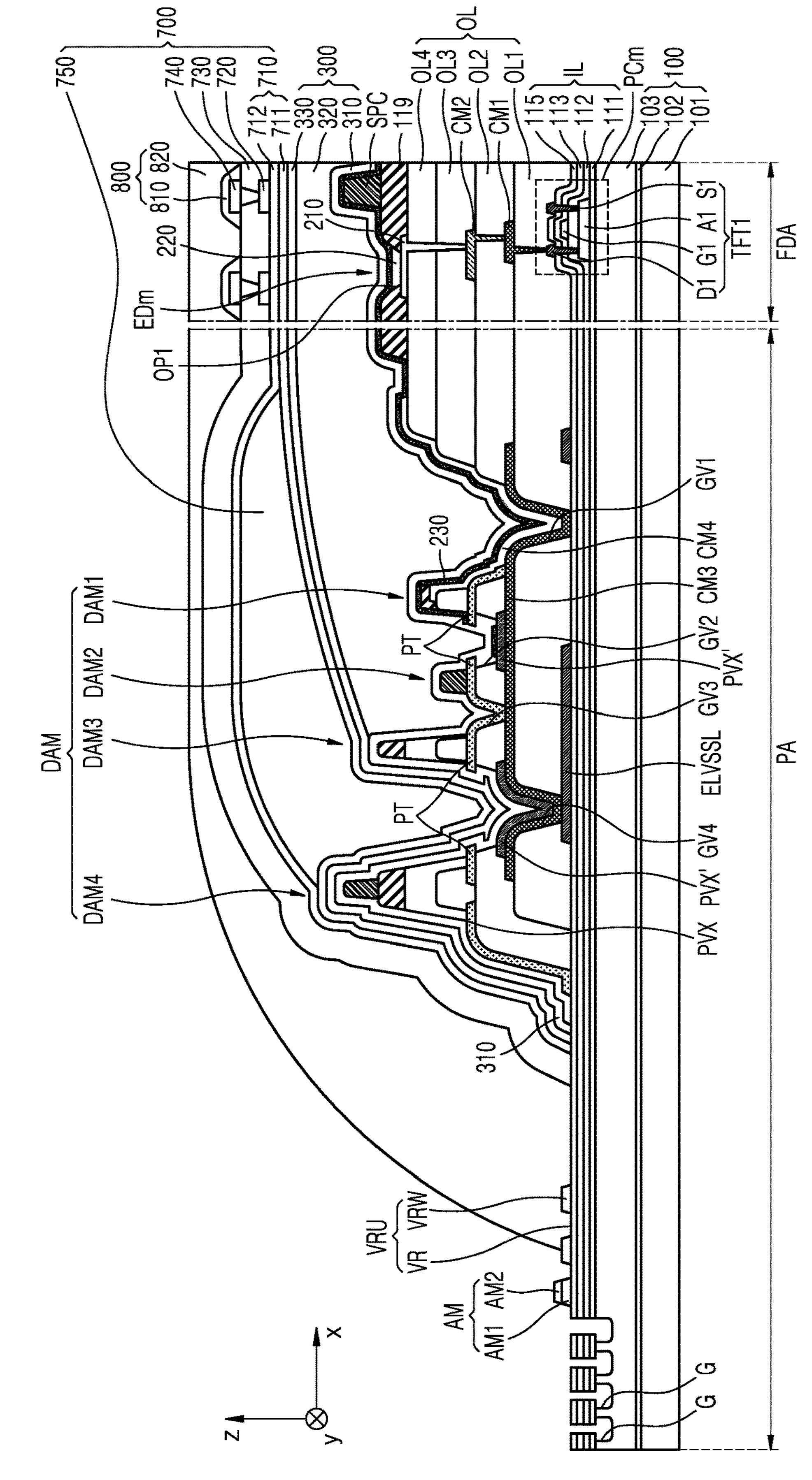
FIG. 10 is a cross-sectional view schematically illustrating a portion of a display panel according to an embodiment.

FIG. 10 is a cross-sectional view schematically illustrating a portion of a display panel according to an embodiment. Specifically, FIG. 10 illustrates a front display area FDA and a portion of a peripheral area PA of the display panel. In FIG. 10, the same reference numerals as in FIG. 9 refer to the same members, and duplicate descriptions are omitted.

Referring to FIG. 10, a dam portion DAM including a plurality of dams may be arranged in the peripheral area PA. The dam portion DAM may be a member for blocking the flow of organic material forming the organic encapsulation layer 320 of the thin-film encapsulation layer 300 when forming the organic encapsulation layer.

The dam portion DAM may include a first dam DAM1, a second dam DAM2, a third dam DAM3, and a fourth dam DAM4. The first dam DAM1, second dam DAM2, third dam DAM3, and fourth dam DAM4 may be provided to include a plurality of organic layers and inorganic layer PVX stacked together.

The inorganic layer PVX may be provided with an inorganic insulation material. For example, the inorganic layer PVX may be provided with a multi-layer or a single-layer including an inorganic insulation material such as silicon oxide ($SiO_2$) or silicon nitride ($SiN_x$). If the inorganic layer PVX is provided with an inorganic insulation material, the inorganic layer PVX may be formed in a separate mask process.

In another embodiment, the inorganic layer PVX may be provided with a metallic material. For example, the inorganic layer PVX may include a metallic material such as molybdenum (Mo), aluminum (Al), copper (Cu), titanium (Ti), etc., and may be formed in multi-layers or a single-layer including the above metallic materials. If the inorganic layer PVX is provided with a metallic material, the inorganic layer PVX may be simultaneously formed from the same material as the second connection electrode CM2.

The first dam DAM1 is the dam arranged closest to the display area (e.g., the front display area FDA) and may be provided by stacking a first layer made of the same material as the first organic insulation layer OL1, a second layer made of the same material as the second organic insulation layer OL2, a third layer made of the inorganic layer PVX, a fourth layer made of the same material as the third organic insulation layer OL3, and a fifth layer made of the same material as the pixel defining film 119.

The first dam DAM1 may be provided spaced apart from the organic insulation layer OL extending from the display area. A first groove GV1 may be formed between the first dam DAM1 and the organic insulation layer OL. In other words, a first groove GV1 exposing the top surface of the inorganic insulation layer IL may be formed between the dam portion DAM and the organic insulation layer OL. As the first groove GV1 is formed, external air that may infiltrate into the display area may be blocked.

The second dam DAM2 may be arranged on the outer side of the first dam DAM1, may be provided by stacking a first layer made of the same material as the first organic insulation layer OL1, a second layer made of the same material as the second organic insulation layer OL2, a third layer made of an inorganic layer PVX, and a fourth layer made of the same material as a spacer SPC. The height of the second dam DAM2 may be provided smaller than the first dam DAM1.

The first dam DAM1 and the second dam DAM2 may share a first layer. A second groove GV2 is arranged between the second layer of the first dam DAM1 and the second layer of the second dam DAM2, and the second layer of the first dam DAM1 and the second layer of the second dam DAM2 may be spaced apart from each other. The inorganic layer PVX may include a protruding tip PT that protrudes into the second groove GV2 between the first dam DAM1 and the second dam DAM2. The counter electrode 230 may be disconnected by the protruding tip PT. By disconnecting the counter electrode 230 included in the light emitting element by the protruding tip PT, the tolerance margin required for depositing the counter electrode 230 may be reduced, thereby dramatically reducing the area of the peripheral area PA.

The third dam DAM3 is arranged on the outer side of the second dam DAM2 and may be provided by stacking a first layer made of the same material as the first organic insulation layer OL1, a second layer made of the same material as the second organic insulation layer OL2, a third layer made of the inorganic layer PVX, a fourth layer made of the same material as the third organic insulation layer OL3, a fifth layer made of the same material as the fourth organic insulation layer OL4, and a sixth layer made of the same material as the pixel defining film 119. The height of the third dam DAM3 may be provided larger than the first dam DAM1 and the second dam DAM2.

The second dam DAM2 and the third dam DAM3 may share a first layer and a third layer. A third groove GV3 is arranged between the second layer of the second dam DAM2 and the second layer of the third dam DAM3, and the second layer of the second dam DAM2 and the second layer of the third dam DAM3 may be spaced apart from each other.

The fourth dam DAM4 may be the outermost dam of the plurality of dams in the dam portion DAM. The fourth dam DAM4 may be provided by stacking a first layer made of the same material as the first organic insulation layer OL1, a second layer made of the same material as the second organic insulation layer OL2, a third layer made of an inorganic layer PVX, and a fourth layer made of the same material as the third organic insulation layer OL3, A fifth layer made of the same material as the fourth organic insulation layer OL4, a sixth layer made of the same material as the pixel defining film 119, and a seventh layer made of the same material as the spacer SPC. The height of the fourth dam DAM4 may be provided larger than the height of the third dam DAM3. An inorganic layer PVX may be disposed to cover the top and sides of the second layer made of the same material as the second organic insulation layer OL2.

A fourth groove GV4 is arranged between the first layer of the third dam DAM3 and the first layer of the fourth dam DAM4, and the first layer of the third dam DAM3 and the first layer of the fourth dam DAM4 may be spaced apart from each other. A common voltage line ELVSSL may be disposed below the third dam DAM3 and the fourth dam DAM4. The common voltage line ELVSSL is a wire that carries a common voltage to the light emitting elements and may be electrically connected to the counter electrode 230.

In some embodiments, the common voltage line ELVSSL may be connected to the counter electrode 230 by the third connection electrode CM3 and the fourth connection electrode CM4. The fourth groove GV4 may function as a contact hole connecting the common voltage line ELVSSL to the third connection electrode CM3. The common voltage line ELVSSL may be disposed on the same layer as the first source electrode S1 and/or the first drain electrode D1 of the first thin-film transistor TFT1. The common voltage line ELVSSL may be disposed on the interlayer insulation layer 115. The common voltage line ELVSSL may be exposed by the fourth groove GV4. The third connection electrode CM3 may be provided in the same layer as the first connection electrode CM1 and made of the same material. The third connection electrode CM3 may be disposed on the first layer of the first dam DAM1 to the fourth dam DAM4 and on the first organic insulation layer OL1.

The third connection electrode CM3 may be in direct contact with the common voltage line ELVSSL at the base of the fourth groove GV4. The third connection electrode CM3 may be formed to extend from the fourth groove GV4 to the first groove GV1, by covering the sidewalls and the bottom of the first and fourth grooves GV1, GV4. The third connection electrode CM3 may be in direct contact with the fourth connection electrode CM4 on the side of the first dam DAM1 or in the first groove GV1. The fourth connection electrode CM4 may be provided with the same material as the first pixel electrode 210. The fourth connection electrode CM4 may be in direct contact with the counter electrode 230 at or near the first groove GV1.

The organic encapsulation layer 320 may be arranged to an inner side of the third dam DAM3. However, the disclosure is not limited thereto. The organic encapsulation layer 320 may be modified in various ways, such as being arranged to an inner side of the fourth dam DAM4.

The first inorganic encapsulation layer 310 and the second inorganic encapsulation layer 330 may contact each other in some areas of the dam portion DAM, and may extend past the dam portion DAM to the edge of the substrate 100. For example, the first inorganic encapsulation layer 310 and the second inorganic encapsulation layer 330 may contact each other from the top surface of the third dam DAM3, and extend to the edge of the substrate 100.

The inorganic layer PVX included in the fourth dam DAM4, which is the outermost dam, may be disposed at least partially on one side of the fourth dam DAM4, on a side of the fourth dam DAM4 that is proximate to an edge of the substrate 100. The first inorganic encapsulation layer 310 may be in direct contact with the inorganic layer PVX on the side of the fourth dam DAM4. The second inorganic encapsulation layer 330 may be in direct contact with the first inorganic encapsulation layer 310 on the side of the fourth dam DAM4.

If the inorganic layer PVX is not arranged on the side of the fourth dam DAM4, which is the outermost dam, the first inorganic encapsulation layer 310 and the second inorganic encapsulation layer 330 may need to be in contact with the top surface of the inorganic insulation layer IL extending from the display area for more than a certain area in order for the thin-film encapsulation layer 300 to block external air.

However, in the present embodiment, the inorganic layer PVX is arranged on the side of the fourth dam DAM4, so that the contact area with the inorganic film may be secured on the side of the fourth dam DAM4, and the contact area with the inorganic insulation layer IL on the top surface of the substrate 100 may be reduced to sufficiently block out external air. Accordingly, the area of the peripheral area PA may be reduced. By reducing the area of the peripheral area PA, the area of the display area of the display apparatus 1 (e.g., refer to FIG. 2) may increase.

In addition, the first inorganic encapsulation layer 310 may clad the edge of the inorganic layer PVX on the top surface of the substrate 100, and the second inorganic encapsulation layer 330 may clad the edge of the first inorganic encapsulation layer 310 on the top surface of the substrate 100. By such a structure, external air may be effectively prevented from infiltrating into the display area.

Although the drawings show the first inorganic encapsulation layer 310 and the second inorganic encapsulation layer 330 spaced apart from the edge of the substrate 100, the disclosure is not limited thereto. In contrast to the drawings, the first inorganic encapsulation layer 310 and the second inorganic encapsulation layer 330 may extend to the edge of the substrate 100.

The substrate 100 may be multi-layered. For example, the substrate 100 may include a first base layer 101, a first barrier layer 102, a second base layer 103, and a second barrier layer (not shown), stacked sequentially.

The first base layer 101 and second base layer 103, may each include a polymeric resin. For example, the first base layer 101 and second base layer 103, may each include a polymeric resin such as polyethersulfone (PES), polyarylate (PAR), polyetherimide (PEI), polyethylene napthalate (PEN), polyethyelenene napthalate (PET), polyethyelene terepthalate (PET), polyphenylene sulfide (PPS), polyallylate, polyimide (PI), polycarbonate (PC), cellulose triacetate (TAC), cellulose acetate propionate (CAP), etc. The aforementioned polymeric resin may be transparent.

The first barrier layer 102 and the second barrier layer are barrier layers that prevent the infiltration of foreign substances, and may be single-layered or multi-layered and include inorganic materials such as silicon nitride ($SiN_x$) and/or silicon oxide ($SiO_x$).

In the present embodiment, a plurality of grooves G formed by removal of the inorganic insulation layer IL and a portion of the substrate 100 may be arranged between the edge of the substrate 100 and the dam portion DAM. For example, the plurality of grooves G may be formed by connecting a hole through the inorganic insulation layer IL and a recess formed in the second base layer 103 of the substrate 100. The inorganic insulation layer IL may be provided with a protruding tip that protrude into the groove G. The plurality of grooves G may be to prevent propagation of cracks that may occur when cutting the edges of the substrate 100.

In the present embodiment, an inorganic protective layer PVX' may be arranged in the third connection electrode CM3. The inorganic protective layer PVX' may be formed to cover a portion of the third connection electrode CM3 to prevent the third connection electrode CM3 from being damaged by an etchant used to etch the first pixel electrode 210. The inorganic protective layer PVX' may be provided with an inorganic material such as silicon nitride ($SiN_x$) and/or silicon oxide ($SiO_x$).

An input sensing layer 700 may be disposed on the thin-film encapsulation layer 300. In this case, the input sensing layer 700 may include a first inorganic insulation layer 710, a first conductive layer 720, a second inorganic insulation layer 730 a second conductive layer 740, and a planarized layer 750. In this case, the first inorganic insulation layer 710 may include a 1-1st inorganic insulation layer 711 and a 1-2nd inorganic insulation layer 712, and a planarized layer 750 may be disposed between the 1-1st inorganic insulation layer 711 and the 1-2nd inorganic insulation layer 712. In this case, the input sensing layer 700 is the same or similar to that described above, and will not be described in detail.

On the input sensing layer 700, an optical function layer 800 including a first layer 810 and a second layer 820 may be disposed. In this case, the optical function layer 800 may be the same or similar to that described above.

In the peripheral area PA, an alignment mark AM and a valley unit VRU may be arranged. The alignment mark AM may be disposed to be stacked on each other and may include a plurality of layers (for example, a plurality of alignment marks). For ease of explanation, the following description will focus on a case where the alignment mark AM including a first alignment mark AM1 and a second alignment mark AM2.

The first alignment mark AM1 and the second alignment mark AM2 as described above may be on each other. In this case, the first alignment mark AM1 and the second alignment mark AM2 may be in direct contact with each other. In other words, no other material may be disposed between the first alignment mark AM1 and the second alignment mark AM2. Although not illustrated in the drawings, in the case of at least three alignment marks AM, adjacent alignment marks AM may be disposed to contact each other.

At least one of the first alignment mark AM1 and the second alignment mark AM2 may include at least one of the plurality of conductive layers of the display panel 10 (e.g., refer to FIG. 3). For example, the plurality of conductive layers of the display panel 10 may include electrodes and wiring of the display panel 10. For example, the plurality of conductive layers of the display panel 10 may include a first gate electrode G1, a first source electrode S1, a first drain electrode D1, connection electrodes CM1, CM2, CM3, and CM4, a first and second pixel electrodes 210 and 212, counter electrode 230, connection wiring WL (refer to FIG. 8), common voltage line ELVSSL, data line (data line DL of FIG. 5), scan line (scan line SL of FIG. 5), the first conductive layer 720 and the second conductive layer 740.

At least one of the first alignment mark AM1 and the second alignment mark AM2 may include one of the first gate electrode G1, the first source electrode S1, the first drain electrode D1, connection electrodes CM1, CM2, CM3, and CM4, the first and second pixel electrodes 210 and 212, counter electrode 230, the connection wiring WL, the common voltage line ELVSSL, the data line (the data line DL of FIG. 5), the scan line (the scan line SL of FIG. 5), the first conductive layer 720 and the second conductive layer 740. At least one of the first alignment mark AM1 and the second alignment mark AM2 may be manufactured by the same process as one of the electrodes and wiring above, and may include the same material as one of the first gate electrode G1, the first source electrode S1, the first drain electrode D1, connection electrodes CM1, CM2, CM3, and CM4, the first and second pixel electrodes 210 and 212, counter electrode 230, the connection wiring WL, the common voltage line ELVSSL, the data line (the data line DL of FIG. 5), the scan line (the scan line SL of FIG. 5), the first conductive layer 720 and the second conductive layer 740. In this case, at least one of the first alignment mark AM1 and the second alignment mark AM2 is not limited to the above materials, and may include at least one of the conductive layers, electrodes, and lines formed in the manufacture of the display panel 10.

Each of the first alignment mark AM1 and the second alignment mark AM2 as described above may include two different ones of the first gate electrode G1, the first source electrode S1, the first drain electrode D1, connection electrodes CM1, CM2, CM3, and CM4, the first and second pixel electrodes 210 and 212, counter electrode 230, the connection wiring WL, the common voltage line ELVSSL, the data line (the data line DL of FIG. 5), the scan line (the scan line SL of FIG. 5), the first conductive layer 720 and the second conductive layer 740. For example, one of the first alignment mark AM1 and the second alignment mark AM2 may include one of the first gate electrode G1, the first source electrode S1, the first drain electrode D1, connection electrodes CM1, CM2, CM3, and CM4, the first and second pixel electrodes 210 and 212, counter electrode 230, the connection wiring WL, the common voltage line ELVSSL, the data line (the data line DL of FIG. 5), the scan line (the scan line SL of FIG. 5), the first conductive layer 720 and the second conductive layer 740. The other of the first alignment mark AM1 and the second alignment mark AM2 may include another one of the first gate electrode G1, the first source electrode S1, the first drain electrode D1, connection electrodes CM1, CM2, CM3, and CM4, the first and second pixel electrodes 210 and 212, counter electrode 230, the connection wiring WL, the common voltage line ELVSSL, the data line (the data line DL of FIG. 5), the scan line (the scan line SL of FIG. 5), the first conductive layer 720 and the second conductive layer 740.

The first alignment mark AM1 and the second alignment mark AM2 may be disposed to be stacked on each other. In this case, the first alignment mark AM1 and the second alignment mark AM2 may be in direct contact with each other. The first alignment mark AM1 and the second alignment mark AM2 may be disposed to overlap each other in a plan view. In addition, a separate material may not be disposed on the first alignment mark AM1 and the second alignment mark AM2. In other words, the first alignment mark AM1 and the second alignment mark AM2 may be visible from the outside by being exposed to the outside, such as through a camera.

The thickness of the alignment mark AM (for example, the height measured from the bottom surface of the alignment mark AM to the top surface of the alignment mark AM based on the z direction of FIG. 10) as described above is determined by the first gate electrode G1, the first source electrode S1, the first drain electrode D1, the connection electrodes CM1, CM2, CM3, and CM4, the first and second pixel electrodes 210 and 212, counter electrode 230, connection wiring WL, common voltage line ELVSSL, data line (the data line DL of FIG. 5), scan line (the scan line SL of FIG. 5), or thickness of one of the first conductive layer 720 and the second conductive layer 740 (for example, a height measured in the same way in the same direction as the alignment mark AM). For example, if the first alignment mark AM1 is formed from the same material as the first pixel electrode 210 and the second alignment mark AM2 is formed from the same material as the counter electrode 230, the thickness of the alignment mark AM may be greater than the thickness of the first pixel electrode 210 or the counter electrode 230.

The valley unit VRU may be arranged between the alignment mark AM and the dam portion DAM to reduce migration of the material forming the second layer 820 toward the alignment mark AM.

The valley unit VRU may include a valley reinforced wall VRW and a valley VR. The valley reinforced walls VRW may be arranged to be spaced apart from each other, and the spaced apart space of the valley reinforced walls VRW may be the valley VR. This allows the second layer 820, when formed, to be blocked by the valley reinforced wall VRW adjacent to the dam portion DAM, and the valley unit VRU to block the flow of the material forming the second layer 820 by being contained in the valley VR as well as blocked by the valley reinforced wall VRW adjacent to the alignment mark AM.

The valley reinforced wall VRW may include the same material as the first layer 810. That is, the valley reinforced wall VRW may be formed in a pattern during the formation of the first layer 810. In this case, the planar shape of the valley reinforced wall VRW may be of various shapes. Hereinafter, the planar shape of the valley unit VRU will be described in detail.

Figure 11A:
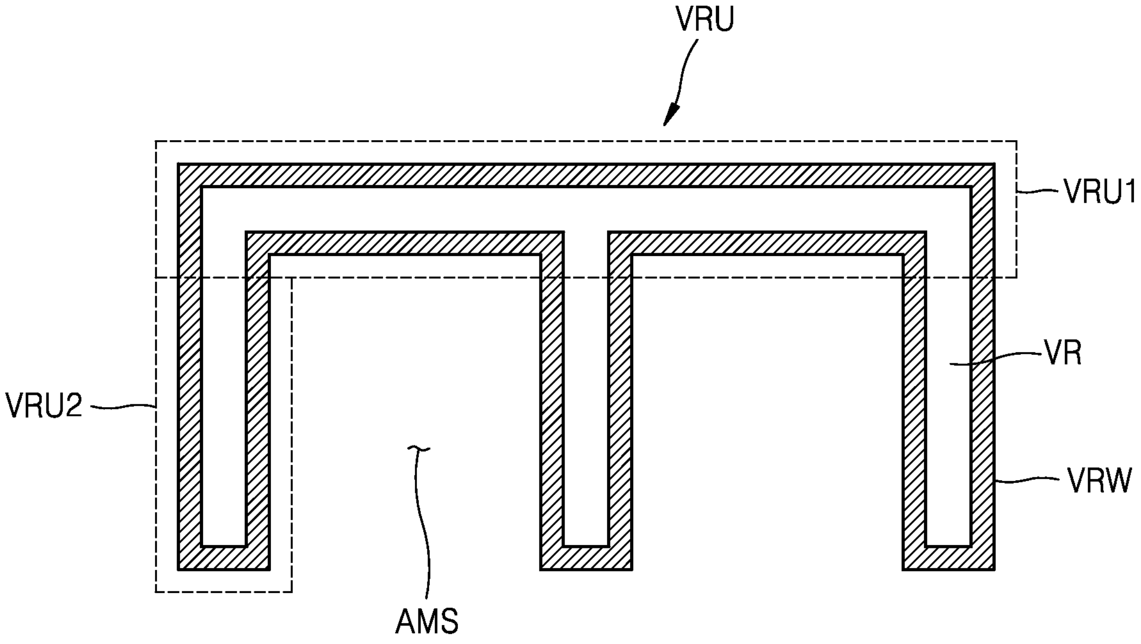
FIG. 11A to FIG. 11E are plan views illustrating a valley unit of a display panel according to an embodiment.

FIG. 11A is a plan view illustrating a valley unit of a display panel according to an embodiment.

Referring to FIG. 11A and in conjunction with FIG. 10, the valley unit VRU may include a first valley unit VRU1 and at least one second valley unit VRU2 that are connected to each other. In this case, the first valley unit VRU1 may be arranged to face the corner display area CDA shown in FIG. 5. In addition, the second valley unit VRU2 may extend in one direction from the first valley unit VRU1. In this case, the first valley unit VRU1 and the second valley unit VRU2 may form a certain angle. if there are multiple second valley units VRU2 (three second valley units VRU2 are shown in the embodiment of FIG. 11A), the second valley units VRU2 may be arranged to be spaced apart from each other and connected to the first valley unit VRU1. The first valley unit VRU1 and the second valley unit VRU2 may be at least partially enclosed by an integral valley reinforced wall VRW. That is, in a plan view, the valley reinforced wall VRW may form a closed-cell shape around the first valley unit VRU1 and the second valley unit VRU2, to define the planar shape of the valley VR.

Although not shown in the drawings, it is also possible that the valley VR of the first valley unit VRU1 and the valley VR of the second valley unit VRU2 are formed so that they are not connected to each other. In such a case, a separate valley reinforced wall may be arranged between the valley VR of the first valley unit VRU1 and the valley VR of the second valley unit VRU2.

The above-mentioned valley unit VRU may be arranged to wrap around at least a portion of the periphery of the alignment mark AM. In this case, the valley unit VRU may be provided with a receiver AMS in which the alignment mark AM is arranged. That is, the first valley unit VRU1 and the two second valley unit VRU2 spaced apart from each other may form a single receiver AMS, and the alignment mark AM may be arranged inside the receiver AMS. In this case, the receiver AMS may include a partially opened opening area. For example, the receiver AMS may have a shape in which the sides, bottom, and/or top of the valley unit VRU are opened in a plan view.

In this case, when forming the second layer 820, the valley unit VRU may block the flow of the material forming the second layer 820, thereby preventing the second layer 820 from being disposed on the alignment mark AM. Specifically, in forming the second layer 820, the material forming the second layer 820 may be fed through a nozzle onto the first layer (not shown) and the 1-1st inorganic insulation layer 711. In this case, the material forming the second layer 820 may flow due to its viscosity. In particular, the material forming the second layer 820 may flow from the front display area FDA to the corner display area CDA, and the valley unit VRU may block the material forming the second layer 820, thereby preventing the material forming the second layer 820 from reaching the alignment mark AM.

Accordingly, the alignment mark AM is not covered by a separate material, allowing it to be read or detected by an external device such as microscope, camera, etc.

Although not shown in the drawings, it is also possible for the valley reinforced wall VRW to have a form in which two portions thereof are separated from each other based on the valley VR. That is, the '⊓' shaped portions of the valley reinforced wall VRW arranged in the top and side with reference to FIG. 11A and the 'E' shaped portions of the valley reinforced wall VRW arranged in the center with reference to FIG. 11A may be formed in a form that separates these two portions from each other.

In addition, although not shown in the drawings, the planar shape of the first valley unit VRU1 may not be straight, but may be in shapes such as a rounded shape or a serpentine shape.

Figure 11B:
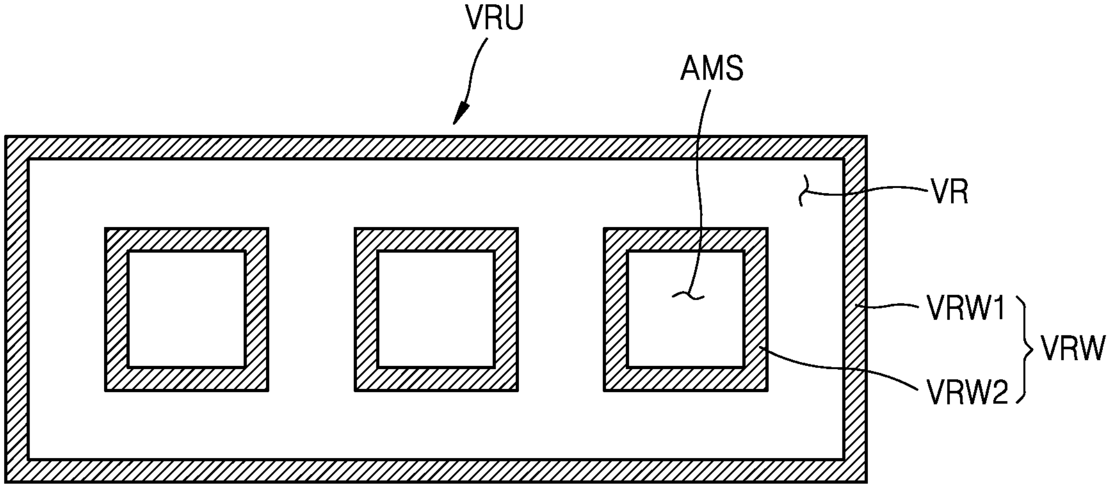

FIG. 11B is a plan view illustrating a valley unit of a display panel according to an embodiment.

Referring to FIG. 11B and in conjunction with FIG. 10, the valley unit VRU may include a first valley reinforced wall VRW1 and a second valley reinforced wall VRW2 (for example, an additional valley reinforced wall). The first valley reinforced wall VRW1 and the second valley reinforced wall VRW2 may be arranged to be spaced apart from each other. For example, the first valley reinforced wall VRW1 may be in a rectangle or square (for example, rectangle) and may be formed in a closed-loop shape to form a space inside. In this case, a second valley reinforced wall VRW2 may be arranged within the space enclosed by the first valley reinforced wall VRW1. The second valley reinforced wall VRW2 may also be formed in a rectangular or square shape (for example, rectangle), and may be formed in a closed loop shape to form a space inside. In this case, the second valley reinforced wall VRW2 may form a receiver AMS to provide a space in which the alignment mark AM is arranged.

In the above case, the inner surface of the first valley reinforced wall VRW1 and the outer surface of the second valley reinforced wall VRW2 may be spaced apart from each other to form a valley VR.

The valley unit VRU may be arranged to face the corner display area CDA as described above to block the flow of the material forming the second layer 820. In doing so, the valley unit VRU may prevent the second layer 820 from being disposed on the alignment mark AM.

Figure 11C:
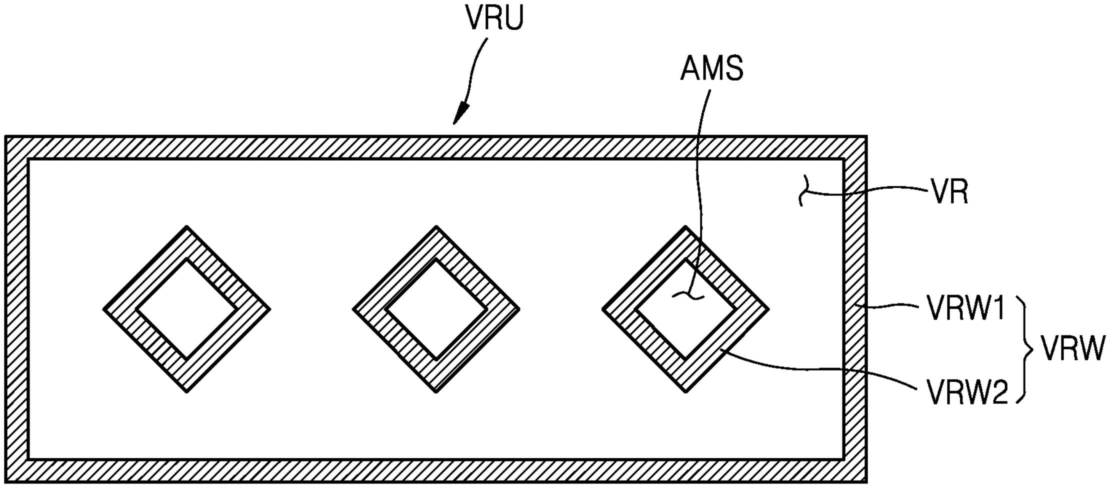

FIG. 11C is a plan view illustrating a valley unit of a display panel according to an embodiment.

Referring to FIG. 11C, the valley unit VRU may include a first valley reinforced wall VRW1 and a second valley reinforced wall VRW2 (for example, an additional valley reinforced wall). In this case, the first valley reinforced wall VRW1 is similar to that described in FIG. 11B and will not be described in detail.

The second valley reinforced wall VRW2 may be formed in the shape of a rhombus. In this case, the second valley reinforced wall VRW2 may include a receiver AMS therein, wherein an alignment mark AM (refer to FIG. 10) may be arranged in the receiver AMS. In this case, the first valley reinforced wall VRW1 and the second valley reinforced wall VRW2 may be spaced apart from each other to form a valley VR.

In the above case, the shape of the first valley reinforced wall VRW1 and the second valley reinforced wall VRW2 is not limited to FIG. 11B and FIG. 11C. For example, the planar shape of at least one of the first valley reinforced wall VRW1 and the second valley reinforced wall VRW2 may be a circle, an ellipse, or a polygon. In another embodiment, the planar shape of at least one of the first valley reinforced wall VRW1 and the second valley reinforced wall VRW2 may be an irregular shape other than circular, elliptical, and polygonal. In such cases, one of the first valley reinforced wall VRW1 and the second valley reinforced wall VRW2 may have a closed-loop shape.

Figure 11D:
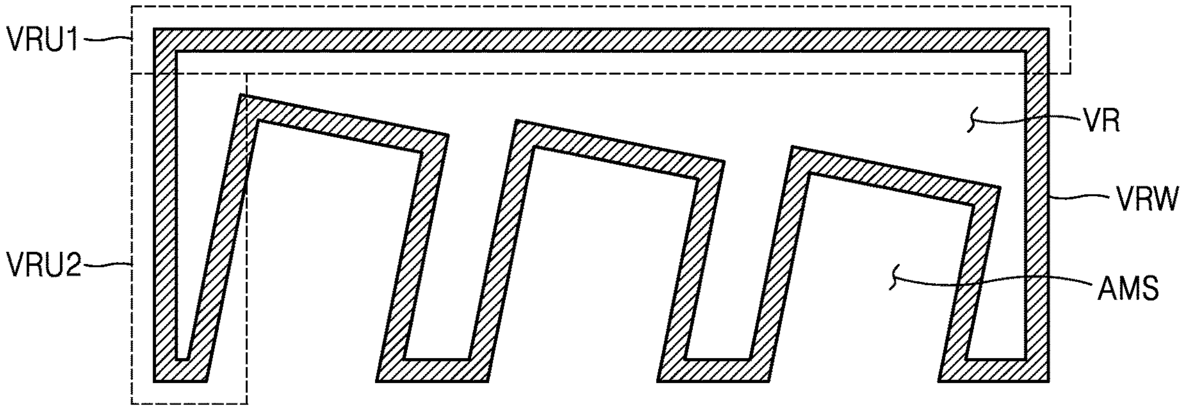

FIG. 11D is a plan view illustrating a valley unit of a display panel according to an embodiment.

Referring to FIG. 11D, the valley unit VRU may include a first valley unit VRU1 and a plurality of second valley units VRU2. The valley unit VRU may include a valley reinforced wall VRW defining a border of the first valley unit VRU1 and the second valley units VRU2, and a valley VR defined by the valley reinforced wall VRW.

At least one of the second valley units VRU2 may protrude in a diagonal direction from the first valley unit VRU1. For example, among the second valley units VRU2, the second valley unit VRU2 arranged at the two ends of the first valley unit VRU1 may protrude in a straight line that is perpendicular to the first valley unit VRU1. Among the second valley units VRU2, the second valley unit VRU2 arranged between the two ends of the first valley unit VRU1 may protrude in an oblique direction (oblique relative to the length direction of the first valley unit VRU1) from the first valley unit VRU1.

Although not depicted in the figures, the first valley unit VRU1 and the second valley unit VRU2 spaced apart from each other may form a receiver AMS in which the alignment mark AM (refer to FIG. 10) is arranged.

Figure 11E:
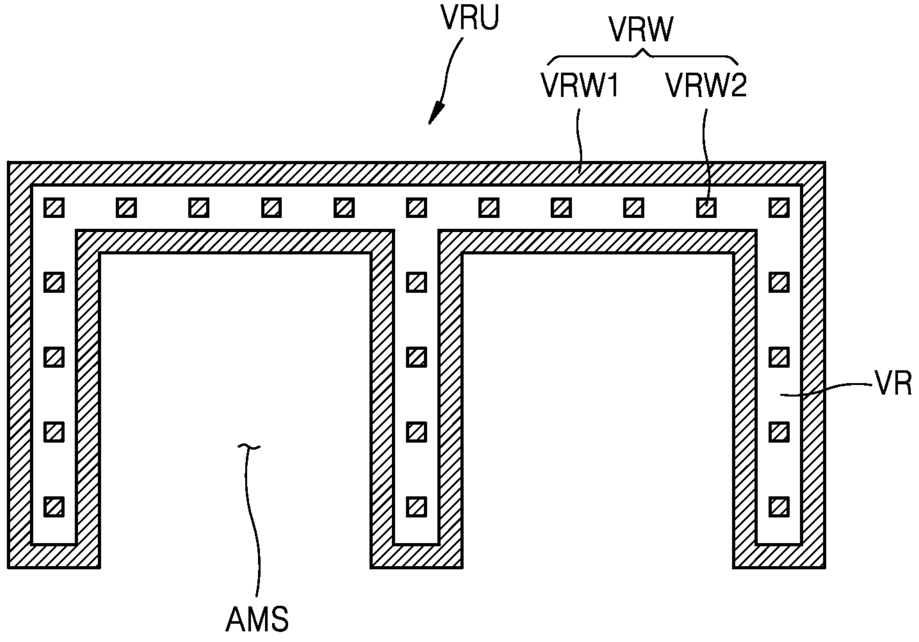
Figure 11F:
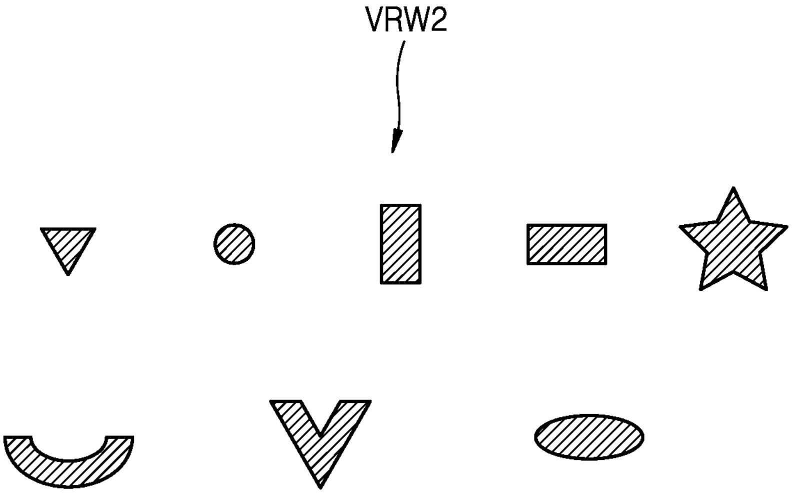
FIG. 11F is a plan view illustrating embodiments of a second valley reinforced wall shown in FIG. 11E.

FIG. 11E is a plan view illustrating the valley unit of a display panel according to an embodiment. FIG. 11F is a plan view illustrating embodiments of the second valley reinforced wall shown in FIG. 11E.

Referring to FIG. 11E and FIG. 11F, the valley unit VRU may include a first valley reinforced wall VRW1, a second valley reinforced wall VRW2, and a valley VR. In this case, the first valley reinforced wall VRW1 is the same or similar to that described above and will not be described in detail.

The second valley reinforced wall VRW2 (for example, an additional valley reinforced wall) may be arranged to overlap the valley VR. In this case, the second valley reinforced wall VRW2 may have numerous possible shapes. For example, the second valley reinforced wall VRW2 may have a polygonal shape, such as a triangle, square, etc., or an irregular shape, such as a circular, oval, and/or rounded shape, a V-shape, a star shape, etc.

In any of the above cases, the second valley reinforced wall VRW2 may reduce the flow speed of the material forming the second layer after the material forming the second layer flows into the valley VR and fills the valley VR.

Figure 11G:
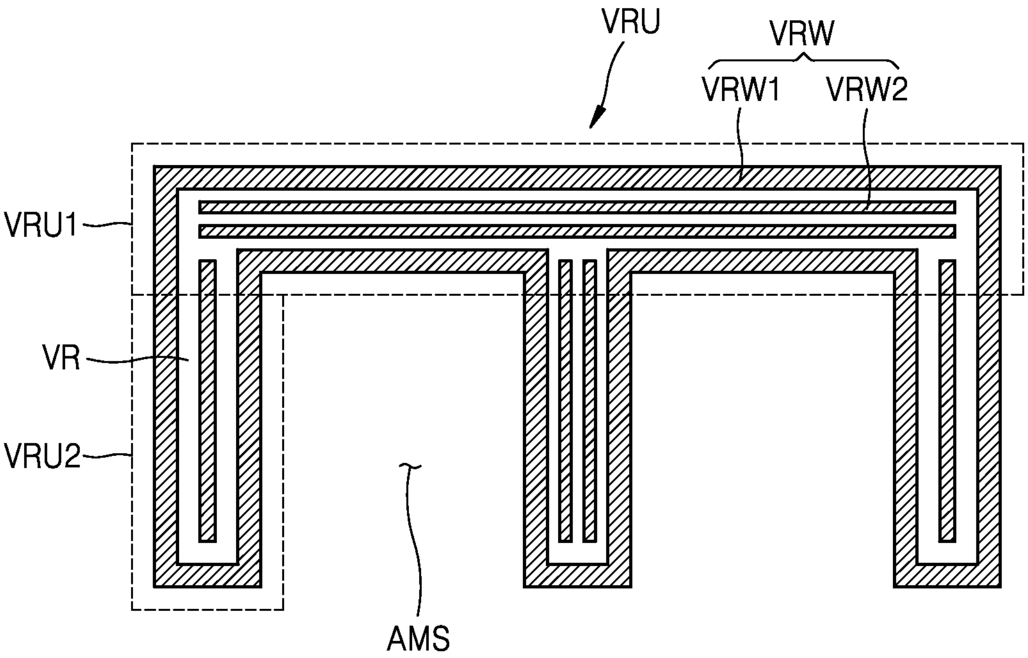
FIG. 11G is a top view illustrating a valley unit of a display panel according to an embodiment.
Figure 11H:
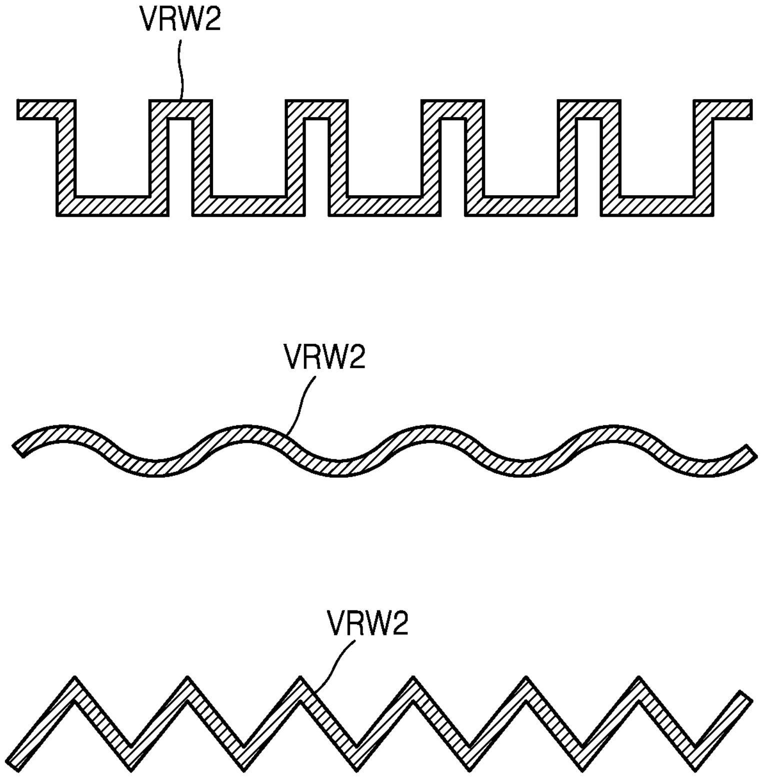
FIG. 11H is a plan view illustrating embodiments of a second valley reinforced wall shown in FIG. 11G.

FIG. 11G is a top view illustrating a valley unit of a display panel according to an embodiment. FIG. 11H is a plan view illustrating embodiments of the second valley reinforced wall shown in FIG. 11G.

Referring to FIG. 11G and FIG. 11H, the valley unit VRU may include a first valley reinforced wall VRW1, a second valley reinforced wall VRW2 (for example, an additional valley reinforced wall), and a valley VR. In this case, the first valley reinforced wall VRW1 and the valley VR are the same or similar to those described above and will not be described in detail.

A second valley reinforced wall VRW2 may be arranged in the valley VR. The planar shape of the second valley reinforced wall VRW2 may be many possible shapes. For example, the planar shape of the second valley reinforced wall VRW2 may include straight lines meeting at various angles to form a repeating pattern. For example, in the case of the top embodiment in FIG. 11H, the lines meet at ninety-degree angles and the line segments have different lengths. In the case of the bottom embodiment in FIG. 11H, the line segments have a uniform length and meet at a non-right angle. In another embodiment, the planar shape of the second valley reinforced wall VRW2 may be curved to a predetermined curvature to generate a wave pattern as shown in the middle portion of FIG. 11H. The planar shape of the second valley reinforced wall VRW2 is not limited to the above and may include any structure that includes protruding portions and concave portions relative to the direction of the flow of the material forming the second layer (not shown) so as to impede the flow of the material forming the second layer. For example, the second valley reinforced wall VRW2 may include both linear segments and curved portions.

Figure 11I:
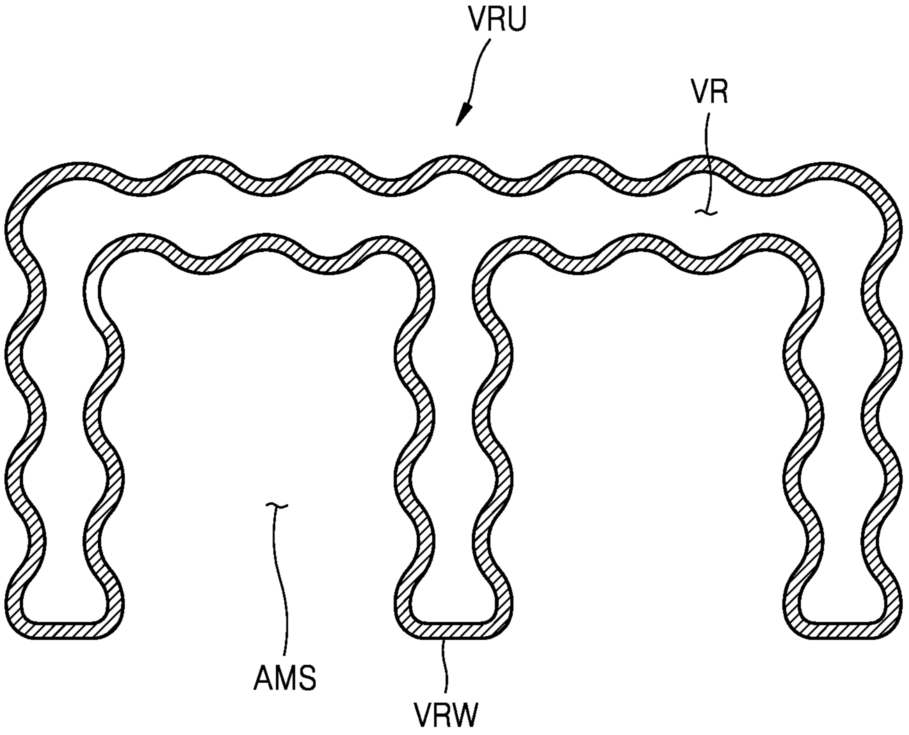
FIG. 11I is a plan view illustrating a valley unit of a display panel according to an embodiment.

FIG. 11I is a plan view illustrating a valley unit of a display panel according to an embodiment.

Referring to FIG. 11I, the valley unit VRU may include a valley reinforced wall VRW and a valley VR. The outer surface of the valley reinforced wall VRW may have a nonlinear shape. For example, the border of the valley reinforced wall VRW may have a wavy shape. This allows the valley reinforced wall VRW to block the flow of the material forming the second layer (not shown) through the concave and convex portions.

Figure 12:
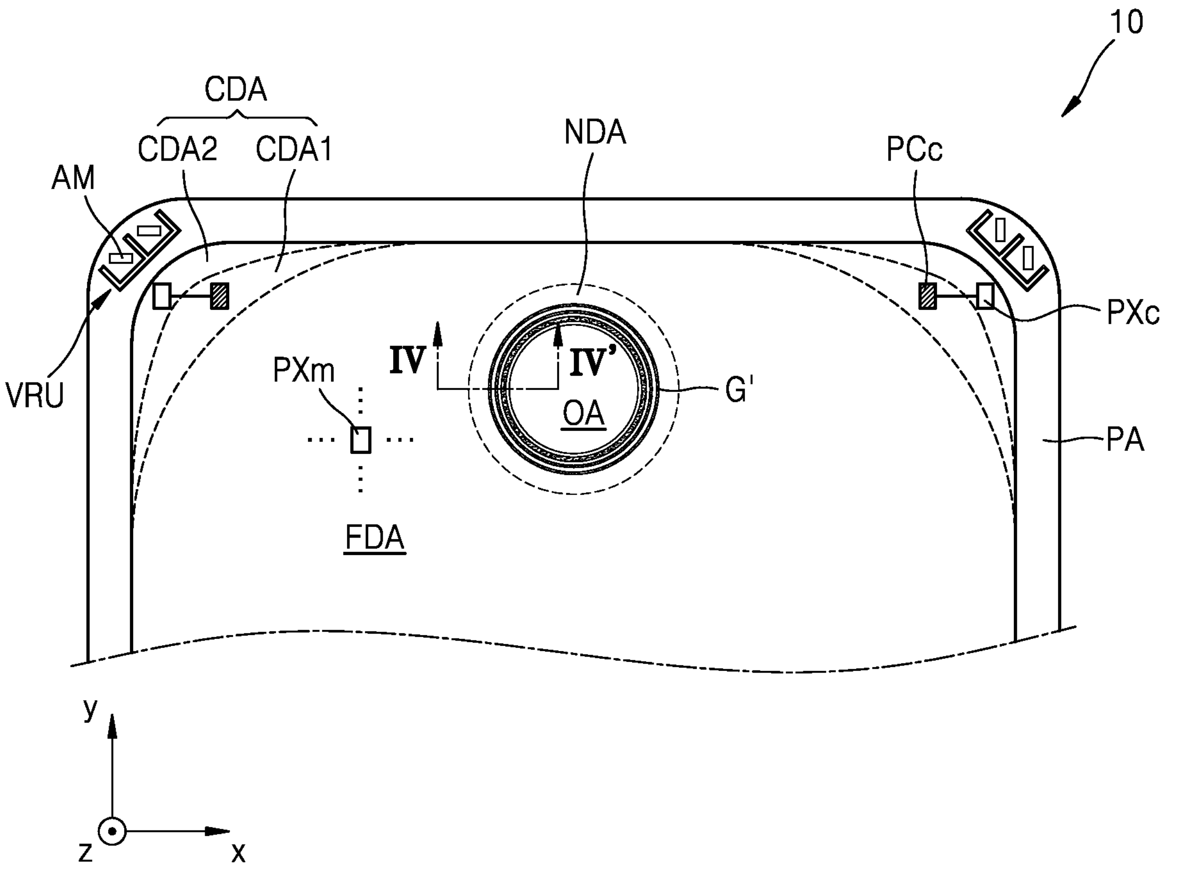
FIG. 12 is a schematic top view illustrating a portion of a display panel in an unfolded state, according to an embodiment.
Figure 13:
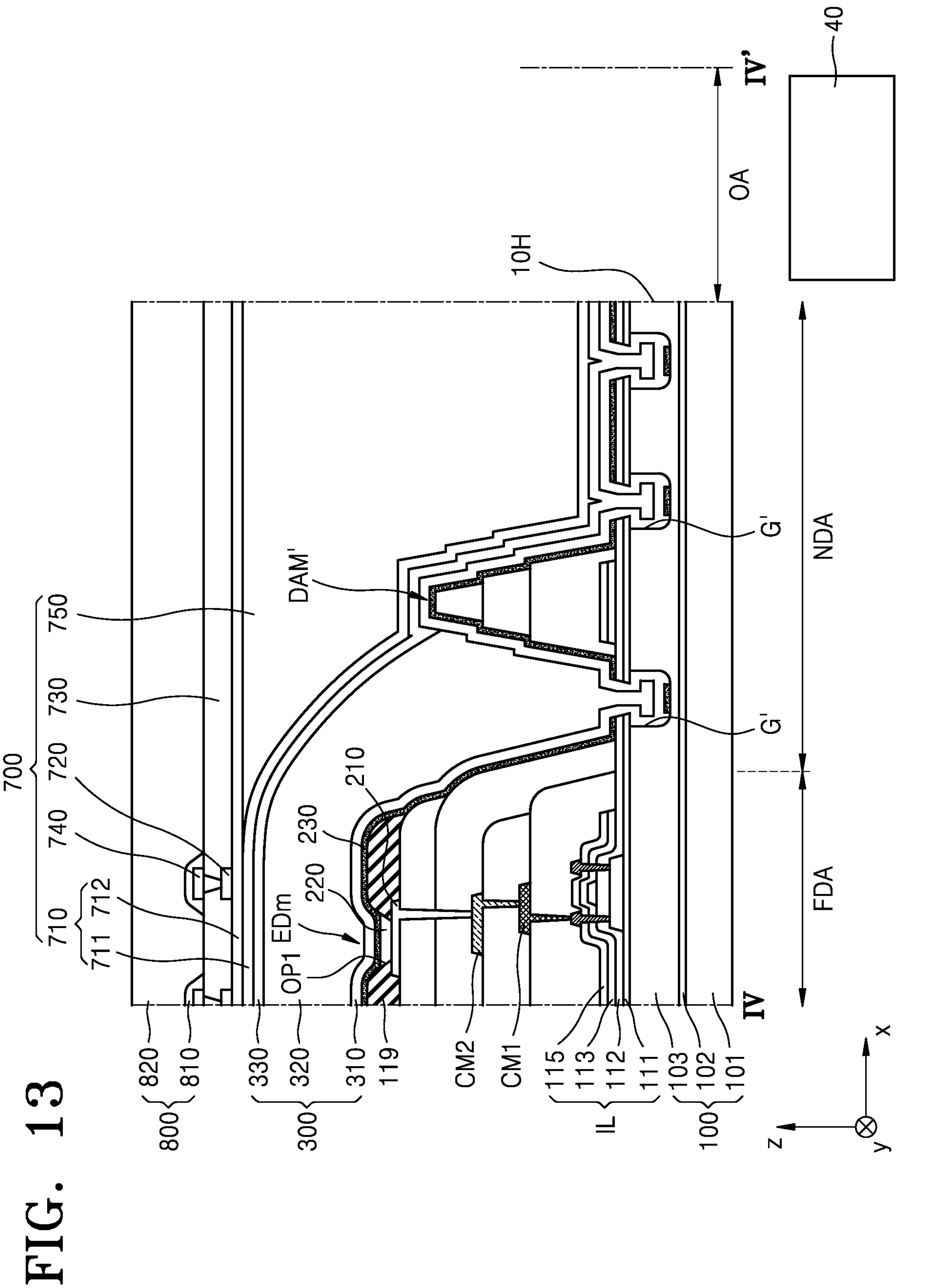
FIG. 13 is a schematic cross-sectional view of a display panel corresponding to line IV-IV' in FIG. 12.

FIG. 12 is a schematic top view illustrating a portion of a display panel in an unfolded state, according to an embodiment. FIG. 13 is a schematic cross-sectional view of a display panel corresponding to line IV-IV' in FIG. 12.

Referring to FIG. 12, as an embodiment, the display panel 10 may include a front display area FDA, a side display area SDA, and a corner display area CDA as shown in FIG. 5 or FIG. 12. The display panel 10 may include an opening area OA arranged in an inner side of the front display area FDA and a non-display area NDA surrounding the opening area OA.

In another embodiment, the display panel 10 may include a display area (not shown), a peripheral area PA, an opening area OA, and a non-display area NDA. The display area may integrally form the front display area FDA, the side display area SDA, and the corner display area CDA as shown in FIG. 5 or FIG. 12, and the plurality of main light emitting elements described above may be arranged in the display area to be spaced apart from each other. The display area may form a single flat surface. In addition, the opening area OA may be arranged in the inner side of the display area. However, for ease of explanation, the following will be described in detail centering on the case where the display panel 10 is as shown in FIG. 5 or FIG. 12.

The planar shape of the opening area OA may be various shapes, such as a circle, an oval, a polygon such as a square, a star shape, or a diamond shape, etc. The position of the opening area OA may also be variously modified. For example, the opening area OA may be arranged at the top center of the front display area FDA as shown in FIG. 12, or may be arranged at the right center or left center of the front display area FDA (not shown).

As shown in FIG. 13, a component 40 may be disposed below the display panel 10 corresponding to the opening area OA. The component 40 may be a camera utilizing infrared or visible light, and may have an imaging element. Alternatively, the component 40 may be a solar cell, a flash, a light sensor, a proximity sensor, or an iris sensor. Alternatively, the component 40 may have a function of receiving sound.

Referring again to FIG. 12, the non-display area NDA may surround the opening area OA. The non-display area NDA is an area in which no display elements such as light emission diodes are arranged, and the non-display area NDA may have trace lines passing through that provides signals to the main pixels PXm arranged around the opening area OA, or may have additional groove G'.

FIG. 12 shows three additional grooves G' located in the non-display area NDA, but the disclosure is not limited thereto. In another embodiment, one, two, or more than four grooves may be arranged in the non-display area NDA.

The additional grooves G' may be formed in the shape of a ring that entirely surrounds the opening area OA in the first non-display area NDA1. The diameter of each of the additional grooves G' may be formed to be larger than the diameter of the opening area OA. In a plan view, the additional grooves G' surrounding the opening area OA may be spaced apart by a certain distance.

Referring to FIG. 13, the display panel 10 may include a first opening 10H defining the opening area OA. A main light emitting element EDm may be arranged in the front display area FDA, and counter electrode 230 of the main light emitting element EDm may extend into the non-display area NDA.

The non-display area NDA may have a plurality of additional grooves G' arranged. The additional groove G' may be formed by spatially connecting a recess that partially removes the second base layer 103 of the substrate 100 and a hole that extends through the inorganic insulation layer IL (layers 111, 112, 113, and 115).

The inorganic insulation layer IL may be provided with protruding tips that protrude into the additional groove G'. These protruding tips of the inorganic insulation layer IL may disconnect the organic layer (not shown) and the counter electrode 230, which may be included in the main light emitting element EDm, around the additional groove G'.

The first inorganic encapsulation layer 310 of the thin-film encapsulation layer 300 has relatively better step coverage than the counter electrode 230. Therefore, the first inorganic encapsulation layer 310 may be formed continuously without being disconnected by the additional groove G'.

An additional dam DAM' may be arranged in the non-display area NDA, and may block the flow of the material forming the organic encapsulation layer 320. Between the additional dam DAM' and the opening area OA, the first inorganic encapsulation layer 310 and the second inorganic encapsulation layer 330 may be in contact with each other.

An additional groove G' formed in the non-display area NDA may be formed simultaneously with the plurality of grooves G described in FIG. 10.

The input sensing layer 700 may be arranged in the display area (not shown) and the non-display area NDA. In this case, the input sensing layer 700 may include a first inorganic insulation layer 710, a first conductive layer 720, a second conductive layer 740, and a second inorganic insulation layer 730. Additionally, the first inorganic insulation layer 710 may include a 1-1st inorganic insulation layer 711 and a 1-2nd inorganic insulation layer 712, and the input sensing layer 700 may include a planarized layer 750 disposed between the 1-1st inorganic insulation layer 711 and the 1-2nd inorganic insulation layer 712.

An optical function layer 800 may be disposed on the input sensing layer 700. The optical function layer 800 may include a first layer 810 and a second layer 820 that has a different refractive index. Hereinafter, a process of manufacturing the display panel 10 will be described in detail.

Figure 14:
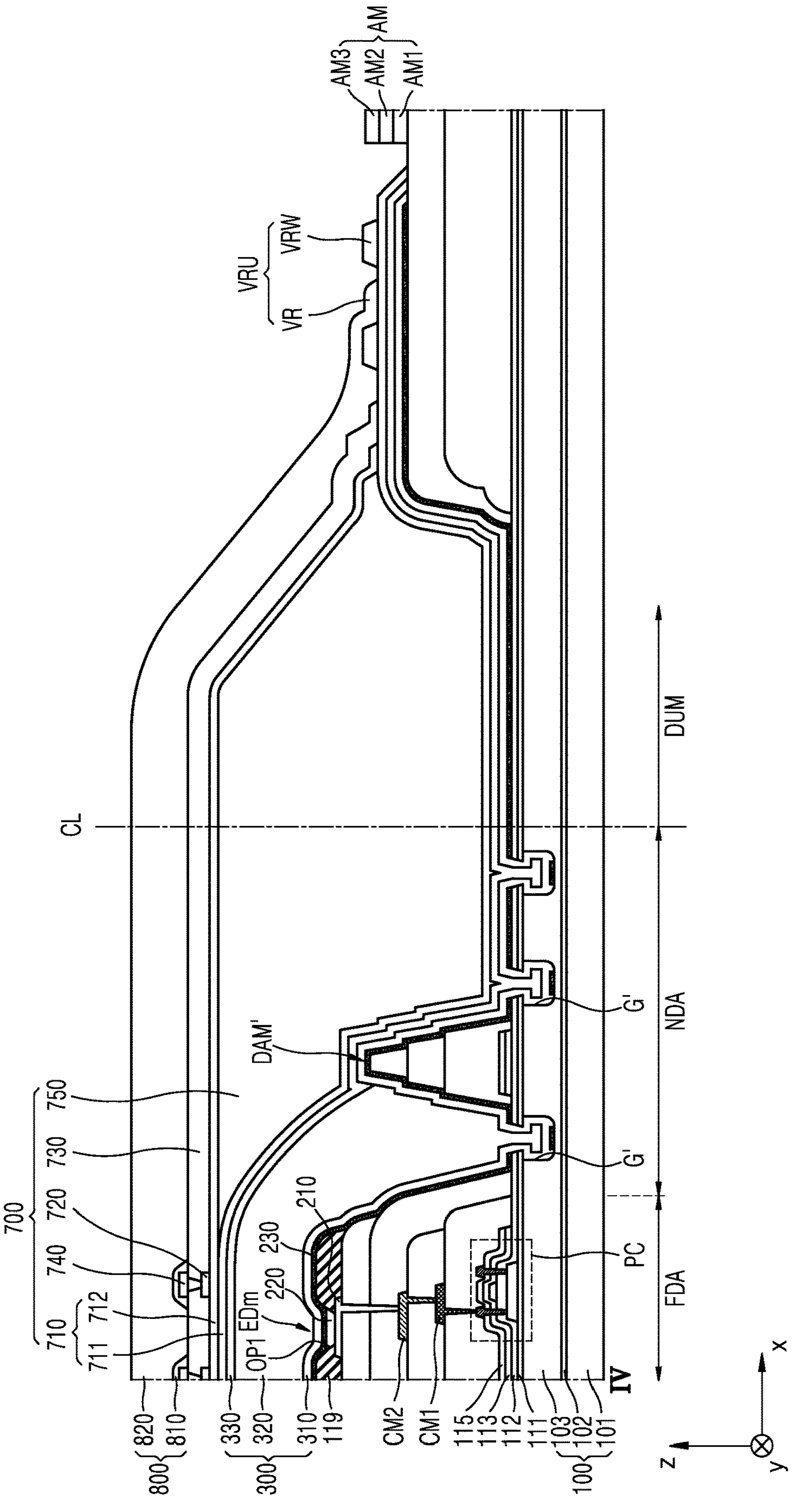
FIG. 14 is a cross-sectional view illustrating a portion of a process of manufacturing the display panel shown in FIG. 12.

FIG. 14 is a cross-sectional view illustrating a portion of a process of manufacturing the display panel shown in FIG. 12.

Referring to FIG. 14 and in conjunction with FIGS. 7, 8 and 10, after arranging a pixel circuit PC and a light emitting element EDm, EDc above a substrate 100, a thin-film encapsulation layer 300 may be disposed on the light emitting elements EDm and EDc. In addition, the input sensing layer 700 and the optical function layer 800 may be sequentially disposed on the thin-film encapsulation layer 300. In this case, a portion corresponding to the component area may be arranged in the substrate 100. In this case, a structure similar to the structure shown in FIG. 14 may be arranged in both the left and right sides based on the center line of FIG. 14.

An alignment mark AM may be arranged in the area corresponding to the component area as described above. The alignment mark AM may include at least two alignment mark layers. In this case, the alignment mark layer may be a conductive layer. For example, the alignment mark AM may include a first alignment mark layer (e.g., first alignment mark AM1), a second alignment mark layer (e.g., second alignment mark AM2), and a third alignment mark layer (e.g., third alignment mark AM3). In this case, the first alignment mark AM1, second alignment mark AM2, and third alignment mark AM3 may be stacked on each other, and one of the stacked first alignment mark AM1, second alignment mark AM2, and third alignment mark AM3 may be in direct contact with another one of the first alignment mark AM1, second alignment mark AM2, and third alignment mark AM3. In this case, at least one of the first alignment mark AM1, the second alignment mark AM2, and the third alignment mark AM3 may include the same material as at least one of a first gate electrode G1, a first source electrode S1, a first drain electrode D1, connection electrodes CM1, CM2, CM3, and CM4, first and second pixel electrodes 210 and 212, counter electrode 230, connection wiring WL, common voltage line ELVSSL, data line (the data line DL of FIG. 5), scan line (the scan line SL of FIG. 5), the first conductive layer 720 and the second conductive layer 740. In this case, materials included in at least one of the first alignment mark AM1 and the third alignment mark AM3 is not limited to the above materials, but may include the same material as at least one of a plurality of conductive layers formed in the manufacture of the display panel 10.

The thickness of the alignment mark AM may be greater than the thickness of one of the first gate electrode G1, the first source electrode S1, the first drain electrode D1, the connection electrodes CM1, CM2, CM3, and CM4, and the first and second pixel electrodes 210 and 212, counter electrode 230, connection wiring WL, common voltage line ELVSSL, data line (the data line DL of FIG. 5), scan line (the scan line SL of FIG. 5), or the first conductive layer 720 and the second conductive layer 740. In addition, the first alignment mark AM1, the second alignment mark AM2, and the third alignment mark AM3 may be disposed to overlap each other in a plan view.

In the above case, a valley unit VRU may be arranged between the alignment mark AM and the additional grooves G'. In this case, the valley unit VRU may have the same or similar shape as those described above. The valley reinforced wall VRW of the valley unit VRU may have the same material as the first layer 810. In this case, the valley reinforced wall VRW may be formed into a planar shape in a separate process after the first layer 810 is formed, and by forming the valley reinforced wall VRW, the valley reinforced wall VRW may define a valley VR.

In the above case, the valley unit VRU may prevent the material of forming the second layer 820 from migrating toward the alignment mark AM.

If the optical function layer 800 is disposed on the input sensing layer 700, the first layer 810 may be disposed on the input sensing layer 700. In this case, a valley reinforced wall VRW may be formed with the first layer 810. In this case, the valley reinforced wall VRW may be formed by curing the first layer 810 after arranging the first layer 810 in a certain area in the substrate 100. In this case, the valley reinforced wall VRW may be formed by removing a portion of the first layer 810.

After forming the first layer 810 and the valley reinforced wall VRW as described above, a second layer 820 may be disposed on the first layer 810. In this case, the second layer 820 may be provided on the first layer 810 by inkjet printing through a nozzle. In this case, the material forming the second layer 820 may flow over the input sensing layer 700, and the material forming a portion of the second layer 820 may flow toward the alignment mark AM. In this case, the valley reinforced wall VRW may first stop the flow of the material forming the second layer 820, and the valley VR may contain a portion of the second layer 820 to prevent further flow of the material forming the second layer 820 toward the alignment mark AM.

In the above case, the alignment mark AM may be viewed through a microscope or a camera etc., and a portion of the display panel 10, the input sensing layer 700, and the optical function layer 800 may be removed based on the cut line CL after comparing the location of the alignment mark AM with the preset location. In this case, the cut line CL may correspond to the first opening 10H shown in FIG. 13. In addition, in a plan view, the alignment mark AM and the valley unit VRU may be arranged in an inner side of the opening area OA of FIG. 12 (for example, in the inner side of the innermost additional groove G'). In this case, when the display panel 10 is arranged along the cut line CL, the portion of the display panel 10 in which the alignment mark AM and the valley unit VRU are disposed may be removed.

Accordingly, the display apparatus (not shown) may prevent the alignment mark AM from being blocked by the second layer 820 during manufacturing. This enables the alignment mark AM to be accurately visible, thereby enabling the manufacturing process to be performed with precision.

The invention has thus been described with reference to the embodiments shown in the drawings, which are exemplary only, and one of ordinary skill in the art will understand that various modifications and variations of the embodiments are possible. Therefore, the true scope of technical protection of the disclosure will be determined by the technical idea of the appended patent claims.

As noted above, the display panels and display apparatus of the present embodiments may include a corner display area to expand the area in which the image is displayed.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:

a substrate comprising a display area and a peripheral area adjacent to the display area;

a display layer comprising a display element arranged in the display area;

a dam portion comprising a plurality of dams arranged in the peripheral area;

a groove arranged in the peripheral area and spaced apart from the dam portion;

an input sensing layer disposed on the display layer; and an alignment mark comprising a plurality of stacked alignment mark layers, that are detectable to an outside device and arranged between the dam portion and the groove, wherein the plurality of alignment mark layers are in direct contact with each other, and at least one of the plurality of alignment mark layers comprises the same material as at least one of a plurality of conductive layers in at least one of the display layer and the input sensing layer.

2. The display panel of claim 1, wherein one of the plurality of alignment mark layers comprises the same material as one of a gate electrode, a source electrode, a drain electrode, a connection electrode, a pixel electrode, a counter electrode, a first touch electrode, a second touch electrode, a common voltage line, and a connection wiring, another one of the plurality of alignment mark layers comprises the same material as another of the gate electrode, the source electrode, the drain electrode, the connection electrode, the pixel electrode, the counter electrode, the first touch electrode, the second touch electrode, the common voltage line, and the connection wiring.

3. The display panel of claim 1, wherein a thickness of the alignment mark is greater than a thickness of one of the plurality of conductive layers.

4. A display panel comprising:

a substrate comprising a display area and a peripheral area adjacent to the display area;

a display layer comprising a display element arranged in the display area;

an optical function layer disposed on the display layer and comprising a first layer and a second layer;

an alignment mark arranged in the peripheral area of the substrate; and a valley unit arranged to wrap around at least a portion of the alignment mark in a plan view and comprising at least one valley to block a flow of a material forming the second layer.

5. The display panel of claim 4, wherein the valley unit comprises a valley reinforced wall defining a boundary of the valley unit.

6. The display panel of claim 5, wherein the valley reinforced wall is made of the same material as the first layer.

7. The display panel of claim 4, wherein the valley unit comprises:

a first valley unit extending in a first direction; and a second valley unit extending from the first valley unit in a second direction.

8. The display panel of claim 4, wherein a valley reinforced wall defining a border of the valley unit comprises at least one of angles and curves.

9. The display panel of claim 4, wherein the valley unit comprises:

a first valley reinforced wall defining a border of the valley unit; and a second valley reinforced wall arranged within the at least one valley that is enclosed by the first valley reinforced wall.

10. The display panel of claim 4, further comprising:

a dam portion comprising a plurality of dams arranged in the peripheral area; and a groove arranged in the peripheral area and spaced apart from the dam portion, wherein the valley unit is arranged between the dam portion and the groove.

11. The display panel of claim 4, wherein the valley unit is provided with a receiver in which the alignment mark is arranged.

12. The display panel of claim 4, wherein the alignment mark comprises a plurality of alignment mark layers including a layer having the same material as at least one of a plurality of conductive layers of at least one of the display layer and an input sensing layer.

13. The display panel of claim 12, wherein the plurality of alignment mark layers are stacked on each other.

14. The display panel of claim 12, wherein one of the plurality of alignment mark layers and another of the plurality of alignment mark layers are in direct contact with each other.

15. The display panel of claim 12, wherein a thickness of the alignment mark is greater than a thickness of one of the plurality of conductive layers.

16. A display apparatus comprising:

a cover window comprising a flat surface portion and a curved surface portion curved at a corner of the flat surface portion;

a display panel arranged on one side of the cover window and comprising a substrate that has a display area overlapping the flat surface portion and a peripheral area adjacent to the display area, wherein the display panel comprises, a display layer comprising a display element arranged in the display area;

an optical function layer disposed on the display layer and comprising a first layer and a second layer;

an alignment mark arranged in the peripheral area of the substrate; and a valley unit comprising at least one valley that wraps around at least a portion of the alignment mark and blocks a flow of a material forming the second layer.

17. The display apparatus of claim 16, wherein the valley unit comprises a valley reinforced wall defining a boundary of the valley unit.

18. The display apparatus of claim 16, wherein the valley unit comprises:

a first valley unit extending in a first direction; and a second valley unit extending from the first valley unit in a second direction.

19. The display apparatus of claim 16, wherein a valley reinforced wall defining a border of the valley unit comprises at least one of angles and curves.

20. The display apparatus of claim 16, wherein the valley unit comprises a first valley reinforced wall defining a border of the valley unit and a second valley reinforced wall arranged within the at least one valley that is enclosed by the first valley reinforced wall.

21. The display apparatus of claim 16, wherein the display panel further comprises:

a dam portion comprising a plurality of dams arranged in the peripheral area; and a groove arranged in the peripheral area and spaced apart from the dam portion, wherein the valley unit is arranged between the dam portion and the groove.

22. The display apparatus of claim 16, wherein the valley unit is provided with a receiver in which the alignment mark is arranged.

23. The display apparatus of claim 16, wherein the alignment mark comprises a plurality of alignment mark layers including a layer that is made of the same material as at least one of a plurality of conductive layers of at least one of the display layer and an input sensing layer.

24. The display apparatus of claim 23, wherein the plurality of alignment mark layers are stacked on each other.

25. The display apparatus of claim 24, wherein two of the plurality of alignment mark layers are in direct contact with each other.

26. The display apparatus of claim 23, wherein a thickness of the alignment mark is greater than a thickness of one of the plurality of conductive layers.

27. The display apparatus of claim 16, wherein the display panel is arranged in an inner side of a front display area, and further comprises an opening area and a non-display area arranged between the opening area and the front display area, wherein a component corresponding to the opening area is disposed below the display panel.

* * * * *